United States Patent
Sakurai et al.

(10) Patent No.: US 7,138,350 B2
(45) Date of Patent: Nov. 21, 2006

(54) MGO VAPOR DEPOSITION MATERIAL AND METHOD FOR PREPARATION THEREOF

(75) Inventors: Hideaki Sakurai, Naka-gun (JP); Ginjiro Toyoguchi, Tokyo (JP); Yoshirou Kuromitsu, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 171 days.

(21) Appl. No.: 10/496,693

(22) PCT Filed: Nov. 29, 2002

(86) PCT No.: PCT/JP02/12541

§ 371 (c)(1), (2), (4) Date: Oct. 27, 2004

(87) PCT Pub. No.: WO03/046249

PCT Pub. Date: Jun. 5, 2003

(65) Prior Publication Data

US 2005/0045065 A1    Mar. 3, 2005

(30) Foreign Application Priority Data

| Nov. 30, 2001 | (JP) | 2001-367344 |
| Nov. 30, 2001 | (JP) | 2001-367345 |
| Nov. 30, 2001 | (JP) | 2001-367346 |
| Nov. 30, 2001 | (JP) | 2001-367347 |
| Nov. 19, 2002 | (JP) | 2002-335649 |
| Nov. 19, 2002 | (JP) | 2002-335650 |
| Nov. 19, 2002 | (JP) | 2002-335651 |
| Nov. 19, 2002 | (JP) | 2002-335652 |

(51) Int. Cl.
*C04B 35/04* (2006.01)
*C09D 1/00* (2006.01)

(52) U.S. Cl. ............... 501/108; 106/286.6; 427/126.3; 427/255.19

(58) Field of Classification Search ............... 501/108; 106/286.6; 427/126.3, 255.19
See application file for complete search history.

(56) References Cited

U.S. PATENT DOCUMENTS

| 6,995,104 B1* | 2/2006 | Park et al. ............... 501/108 |
| 2005/0264211 A1* | 12/2005 | Kim ............... 313/587 |
| 2005/0288169 A1* | 12/2005 | Lee et al. ............... 501/108 |

FOREIGN PATENT DOCUMENTS

| JP | 55-031129 | 3/1980 |
| JP | 63-203764 | 8/1988 |
| JP | 09-235667 | 9/1997 |
| JP | 10-018026 | 1/1998 |
| JP | 11-213875 | 8/1999 |
| JP | 2000-63171 | 2/2000 |

* cited by examiner

*Primary Examiner*—David M. Brunsman
(74) *Attorney, Agent, or Firm*—Oblon, Spivak, McClelland, Maier & Neustadt, P.C.

(57) ABSTRACT

Polycrystals with a MgO purity of at least 99.0%, a relative density of at least 90.0%, a sulfur S content of 0.01 to 50 ppm, a chlorine Cl content of 0.01 to 50 ppm, a nitrogen N content of 0.01 to 200 ppm, and a phosphorus P content of 0.01 to 30 ppm. Even when vapor deposition is conducted using electron beam deposition, almost no splash occurs, and the film characteristics of the product MgO film can also be improved.

26 Claims, 3 Drawing Sheets

MGO VAPOR DEPOSITION MATERIAL AND METHOD FOR PREPARATION THEREOF

This application is a 371 filing of PCT/JP02/12541, filed 29 Nov. 2002.

TECHNICAL FIELD

The present invention relates to a MgO vapor deposition material and a production process for such a material, and relates particularly to technology that is ideal for generating the MgO film of an AC type plasma display panel or the like.

BACKGROUND ART

Because MgO displays excellent heat resistance, conventionally it has been used mainly as a heat resistant material for crucibles and fire bricks and the like, and various techniques have been proposed for improving the mechanical strength, including the addition of sintering assistants. Examples of known techniques include those disclosed in the patent references 1 to 3.

As follows is a list of references.
Patent Reference 1: Japanese Unexamined Patent Application, First Publication No. Hei 07-133149
Patent Reference 2: Japanese Patent No. 2,961,389
Patent Reference 3: Japanese Examined Patent Application, Second Publication No. Hei 07-102988
Patent Reference 4: Japanese Unexamined Patent Application, First Publication No. Hei 11-213875
Patent Reference 5: Japanese Unexamined Patent Application, First Publication No. Hei 05-311412
Patent Reference 6: Japanese Unexamined Patent Application, First Publication No. Hei 10-291854
Patent Reference 7: Japanese Unexamined Patent Application, First Publication No. Hei 10-297955
Patent Reference 8: Japanese Unexamined Patent Application, First Publication No. Hei 10-297956
Patent Reference 9: Japanese Unexamined Patent Application, First Publication No. Hei 11-29857
Patent Reference 10: Japanese Unexamined Patent Application, First Publication No. Hei 11-29355
Patent Reference 11: Japanese Unexamined Patent Application, First Publication No. 2000-63171
Patent Reference 12: Japanese Unexamined Patent Application, First Publication No. Hei 09-235667
Non-Patent Reference 1: IEICE Trans. Electron., vol. E82-C, No. 10, p. 1804–1807 (1999).

In recent years, the research, development, and implementation of flat panel displays, including liquid crystal displays (LCD) has been remarkable, and the production of these displays is increasing rapidly. The development and introduction of color plasma display panels (PDP) has also surged recently. PDPs can be easily produced in very large sizes, and represent the most promising technology for producing a high definition, wall-mounted large screen television. Tests and production of PDPs with a diagonal size in the 60 inch range are already in progress, and of the different PDP technologies, AC type display panels in which the electrode construction utilizes a metal electrode covered with a glass dielectric material are the most common.

In these AC type PDPs, the surface of the glass dielectric layer is coated with a protective film that displays a high heat of sublimation in order to prevent the ion bombardment sputtering from altering the surface of the glass dielectric layer and raising the breakdown voltage. Because it contacts the discharge gas directly, this protective film must not only be resistant to sputtering, but must also perform a plurality of other important roles. Namely, the properties required of this protective film include resistance to sputtering during discharge, a high secondary emission capability (a low discharge voltage), as well as good insulation and light transmittance. MgO films produced by either electron beam deposition or ion plating using MgO as the vapor deposition material are typically used as the material for satisfying these property requirements. As described above, these MgO protective films perform an important role in extending the life of the PDP by protecting the surface of the dielectric layer from the sputtering during discharge, and it is known that increasing the film density of this protective film enables an improvement in the sputtering resistance (non-patent reference 1).

In addition, both single crystal MgO and polycrystalline MgO have been used for this protective film (vapor deposition material). Technology relating to this protective film includes that disclosed in the patent references 6 to 11 listed above.

Furthermore, in a technique disclosed in the patent reference 4, the secondary emission efficiency of the protective film is improved, and display performance problems such as breakdown delay within the light emitting cells and faults within the write operation can be improved, by reducing the electronegative element component such as sulfur within the protective film.

The method used for removing the electronegative element component such as sulfur requires a heat treatment at a temperature of at least 1400° C. in either a vacuum with a pressure of no more than $1.33 \times 10^{-1}$ Pa ($10^{-3}$ Torr) or in an oxygen containing atmosphere, which is performed following crystal growth (pellet preparation) and prior to formation of the protective film, although in the case of polycrystals or single crystals produced using an electromelting method with a relative density of at least 90%, the efficiency of the sulfur removal was poor.

The polycrystalline MgO described above is typically produced by granulating, molding and baking an MgO powder of arbitrary purity and with an arbitrary impurities composition produced by either a sea water method or a vapor phase method. In contrast, single crystal MgO is typically produced by melting MgO clinker or light burned MgO (baked at a temperature of no more than 1000° C.) with a purity of at least 98% in an electric arc furnace, that is forming an ingot by electromelting, and then extracting single crystal portions from this ingot and crushing the product. The MgO powder, MgO clinker, or light burned MgO used as the raw material for producing these products typically comprises a sulfur S component, a chlorine Cl component, a nitrogen N component and a phosphorus P component and the like as impurities, due to the production methods employed and the intrinsic reactivity of MgO.

It is known that during film formation using either an electron beam deposition method or an ion plating method, the quantities of sulfur S, chlorine Cl, nitrogen N and phosphorus P discharged from the MgO vapor deposition material as impurities has a deleterious effect on the level of splash associated with that vapor deposition material. In other words, as the quantities of sulfur S, chlorine Cl, nitrogen N and phosphorus P impurities increase, the level of splash also increases, and if the level of splash is high, then the degree of efficiency with which the quantity of vapor deposition material can be used in the film formation process decreases, resulting in an increase in material costs.

In addition, if the quantities of sulfur S, chlorine Cl, nitrogen N and phosphorus P impurities are high, then control of the crystal orientation and microstructure of the product film becomes difficult, and compact deposition of the MgO film onto the substrate is inhibited, meaning the film density tends to decrease. If the density of the MgO film decreases, then various problems can arise including a reduction in the refractive index, a deterioration in the sputtering resistance, and deterioration in both the discharge characteristics and the insulating characteristics.

In terms of the target material used in the sputtering method, the type of technology disclosed in the patent reference 12 described above is already known.

When preparing a target material for use in a sputtering method, this target material must be produced with as high a density as possible. In contrast, the inventors of the present invention have confirmed that when preparing a vapor deposition material for use in an electron beam deposition method, the density required of the vapor deposition material need not be as precise in terms of the measurement of degassing from the vapor deposition material and the evaluation of the film formation, and the allowable density range for the vapor deposition material is comparatively broad.

Furthermore, the target material and the vapor deposition material are not significantly different in terms of their microstructures, but are very different in macro terms.

Namely, in a sputtering method, the target material is formed as a comparatively large plate such as a circular or angular plate, whereas in an electron beam deposition method, the vapor deposition material is formed as small pellets. In a sputtering method, in which positive ions such as argon cause knock-on at the atomic level of the target material, which functions as the film formation material, thereby depositing this film formation material on a substrate, the reason that the target material is formed as a plate that is comparatively larger than the substrate or the like on which the film is to be formed, is to ensure a more uniform distribution of the thickness of the film produced from the target material.

In contrast, in an electron beam deposition method, in which a material is deposited on a substrate by heating and subsequent conversion to a vapor state using an electron beam, the reason that the vapor deposition material is formed as small pellets is to enable the vapor deposition material to be supplied sequentially to the crucible of the electron beam deposition apparatus. Furthermore, in an electron beam deposition method, because of the so-called splash phenomenon peculiar to electron beam deposition and from the viewpoint of film formation speed, an optimum size exists for the vapor deposition process.

Because the film formation mechanisms for sputtering methods and electron beam deposition methods differ in this manner, the film formation conditions are completely different, and the quality of the product films is also different. Namely, in a sputtering method the composition of the product film varies depending on how easily the target material undergoes sputtering (the sputtering resistance), whereas in an electron beam deposition method the composition of the product film varies depending on how easily the vapor deposition material can be converted to a vapor state (the vapor pressure). As a result, the compositions of films formed from a target material and a vapor deposition material of exactly the same composition will differ, and the quantity of impurities incorporated within each film will also be different.

In addition, in the case of a target material, following formation of a plate-like material by sintering or the like, usually the surface must be polished using a surface grinder or the like to achieve a surface roughness of no more than approximately 1 μm. The reason for this requirement is that if sharp sections exist on the target material, then electrons tend to accumulate at those sections, meaning the argon ion bombardment is also concentrated on those sections, causing a phenomenon known as arcing, which causes non-uniformity in the product film, and consequently these sharp sections must be removed. In contrast in the case of a vapor deposition material, the film formation speed can be increased by ensuring as large a surface roughness as possible. The mechanism behind this finding is unclear, although it is thought that the increase in the evaporation surface area of the vapor deposition material is a significant factor.

Accordingly, a target material and a vapor deposition material only appear to be similar, and just because the compositions and/or forms of the two may be similar does not mean that either one may be appropriately applied within the other field.

DISCLOSURE OF INVENTION

The present invention takes the above factors into consideration, with an object of achieving the objects described below.

1. Reducing splash associated with a vapor deposition material.
2. Optimizing the gasification component in a vapor deposition material.
3. Optimizing the sulfur S content within a vapor deposition material.
4. Optimizing the chlorine Cl content within a vapor deposition material.
5. Optimizing the nitrogen N content within a vapor deposition material.
6. Optimizing the phosphorus P content within a vapor deposition material.
7. Preventing decrease in the density of a MgO film.
8. Preventing decrease in the light transmittance, decrease in the sputtering resistance, and deterioration in the discharge characteristics and insulating characteristics.

A MgO vapor deposition material of the present invention is able to achieve the above objectives by employing polycrystalline pellets with a MgO purity of at least 99.0% a relative density of at least 90.0%, and an average sulfur S content of 0.01 to 50 ppm.

Furthermore in the present invention, the aforementioned polycrystalline pellets preferably comprise a granular portion with a low sulfur S content, and a grain boundary portion with a higher sulfur S content than the granular portion.

Furthermore in the present invention, the ratio between the respective sulfur S contents within the granular portion and the grain boundary portion can be greater than 5.

A MgO vapor deposition material of the present invention is able to achieve the above objectives by employing polycrystalline pellets with a MgO purity of at least 99.0%, a relative density of at least 90.0%, and an average chlorine Cl content of 0.01 to 50 ppm.

Furthermore in the present invention, the aforementioned polycrystalline pellets preferably comprise a granular portion with a low chlorine Cl content, and a grain boundary portion with a higher chlorine Cl content than the granular portion.

Furthermore in the present invention, the ratio between the respective chlorine Cl contents within the granular portion and the grain boundary portion can be greater than 5.

A MgO vapor deposition material of the present invention is able to achieve the above objectives by employing polycrystalline pellets with a MgO purity of at least 99.0%, a relative density of at least 90.0%, and an average nitrogen N content of 0.01 to 200 ppm.

Furthermore in the present invention, the aforementioned polycrystalline pellets preferably comprise a granular portion with a low nitrogen N content, and a grain boundary portion with a higher nitrogen N content than the granular portion.

Furthermore in the present invention, the ratio between the respective nitrogen N contents within the granular portion and the grain boundary portion can be greater than 5.

A MgO vapor deposition material of the present invention is able to achieve the above objectives by employing polycrystalline pellets with a MgO purity of at least 99.0%, a relative density of at least 90.0%, and an average phosphorus P content of 0.01 to 30 ppm.

Furthermore in the present invention, the aforementioned polycrystalline pellets preferably comprise a granular portion with a low phosphorus P content, and a grain boundary portion with a higher phosphorus P content than the granular portion.

Furthermore in the present invention, the ratio between the respective phosphorus P contents within the granular portion and the grain boundary portion can be greater than 5.

In a production process for a MgO vapor deposition material according to the present invention, the objectives described above are achieved by producing polycrystalline pellets by a sintering process using a MgO powder with a sulfur S content of 0.01 to 50 ppm as the raw material.

In the present invention, a granular portion with a low sulfur S content, and a grain boundary portion with a higher sulfur S content than the granular portion are preferably formed in the aforementioned polycrystalline pellets.

In the present invention, the ratio between the respective sulfur S contents within the granular portion and the grain boundary portion can be greater than 5.

In a production process for a MgO vapor deposition material according to the present invention, the objectives described above are achieved by producing polycrystalline pellets by a sintering process using a MgO powder with a chlorine Cl content of 0.01 to 50 ppm as the raw material.

Furthermore in the present invention, the aforementioned polycrystalline pellets preferably comprise a granular portion with a low chlorine Cl content, and a grain boundary portion with a higher chlorine Cl content than the granular portion.

Furthermore in the present invention, the ratio between the respective chlorine Cl contents within the granular portion and the grain boundary portion can be greater than 5.

In a production process for a MgO vapor deposition material according to the present invention, the objectives described above are achieved by producing polycrystalline pellets by a sintering process using a MgO powder with a nitrogen N content of 0.01 to 200 ppm as the raw material.

In the present invention, a granular portion with a low nitrogen N content, and a grain boundary portion with a higher nitrogen N content than the granular portion are preferably formed in the aforementioned polycrystalline pellets.

In the present invention, the ratio between the respective nitrogen N contents within the granular portion and the grain boundary portion can be greater than 5.

In a production process for a MgO vapor deposition material according to the present invention, the objectives described above are achieved by producing polycrystalline pellets by a sintering process using a MgO powder with a phosphorus P content of 0.01 to 30 ppm as the raw material.

In the present invention, a granular portion with a low phosphorus P content, and a grain boundary portion with a higher phosphorus P content than the granular portion are preferably formed in the aforementioned polycrystalline pellets.

In the present invention, the ratio between the respective phosphorus P contents within the granular portion and the grain boundary portion can be greater than 5.

In a MgO vapor deposition material of the present invention, by ensuring a MgO purity of at least 99.0%, a relative density of at least 90.0%, and a sulfur S content of 0.01 to 50 ppm, when the MgO vapor deposition material is used for forming a MgO protective film for an AC type PDP or the like by either an electron beam deposition method or an ion plating method, the level of splash occurrence can be reduced, and the protective film characteristics can be improved. It is thought that the reason for this finding is that by ensuring the settings described above, the gasification component is reduced, thereby reducing the level of splash.

Here, the film characteristics refer to properties such as the MgO film density, the film thickness distribution, the refractive index, the sputtering resistance, the discharge characteristics (such as the discharge voltage and the discharge response), and the insulating characteristics.

If the sulfur S content is set to a value less than 0.01 ppm, then the strength of the vapor deposition material is inadequate, whereas if the sulfur S content is set to a value greater than 50 ppm, then during film formation by either electron beam deposition or ion plating, not only does the level of vapor deposition material splash occurrence increase, which causes a reduction in the degree of efficiency with which the quantity of vapor deposition material can be used in the film formation process, resulting in an increase in material costs, but control of the crystal orientation and microstructure of the product film also becomes difficult, and compact deposition of the MgO film component onto the substrate is inhibited, resulting in an undesirable decrease in the film density.

In a MgO vapor deposition material of the present invention, by ensuring a MgO purity of at least 99.0%, a relative density of at least 90.0%, and a chlorine Cl content of 0.01 to 50 ppm, when the MgO vapor deposition material is used for forming a MgO protective film for an AC type PDP or the like by either an electron beam deposition method or an ion plating method, the level of splash occurrence can be reduced, and the protective film characteristics can be improved. It is thought that the reason for this finding is that by ensuring the settings described above, the gasification component is reduced, thereby reducing the level of splash.

If the chlorine Cl content is set to a value less than 0.01 ppm, then the strength of the vapor deposition material is inadequate, whereas if the chlorine Cl content is set to a value greater than 50 ppm, then during film formation by either electron beam deposition or ion plating, not only does the level of vapor deposition material splash occurrence increase, which causes a reduction in the degree of efficiency with which the quantity of vapor deposition material can be used in the film formation process, resulting in an increase in material costs, but control of the crystal orientation and microstructure of the product film also becomes difficult, and compact deposition of the MgO film component onto the substrate is inhibited, resulting in an undesirable decrease in the film density.

In a MgO vapor deposition material of the present invention, by ensuring a MgO purity of at least 99.0%, a relative density of at least 90.0%, and a nitrogen N content of 0.01 to 200 ppm, when the MgO vapor deposition material is used for forming a MgO protective film for an AC type PDP or the like by either an electron beam deposition method or an ion plating method, the level of splash occurrence can be reduced, and the protective film characteristics can be improved. It is thought that the reason for this finding is that by ensuring the settings described above, the gasification component is reduced, thereby reducing the level of splash.

If the nitrogen N content is set to a value less than 0.01 ppm, then the strength of the vapor deposition material is inadequate, whereas if the nitrogen N content is set to a value greater than 200 ppm, then during film formation by either electron beam deposition or ion plating, not only does the level of vapor deposition material splash occurrence increase, which causes a reduction in the degree of efficiency with which the quantity of vapor deposition material can be used in the film formation process, resulting in an increase in material costs, but control of the crystal orientation and microstructure of the product film also becomes difficult, and compact deposition of the MgO film component onto the substrate is inhibited, resulting in an undesirable decrease in the film density.

In a MgO vapor deposition material of the present invention, by ensuring a MgO purity of at least 99.0%, a relative density of at least 90.0%, and a phosphorus P content of 0.01 to 30 ppm, when the MgO vapor deposition material is used for forming a MgO protective film for an AC type PDP or the like by either an electron beam deposition method or an ion plating method, the level of splash occurrence can be reduced, and the protective film characteristics can be improved. It is thought that the reason for this finding is that by ensuring the settings described above, the gasification component is reduced, thereby reducing the level of splash.

If the phosphorus P content is set to a value less than 0.01 ppm, then the strength of the vapor deposition material is inadequate, whereas if the phosphorus P content is set to a value greater than 30 ppm, then during film formation by either electron beam deposition or ion plating, not only does the level of vapor deposition material splash occurrence increase, which causes a reduction in the degree of efficiency with which the quantity of vapor deposition material can be used in the film formation process, resulting in an increase in material costs, but control of the crystal orientation and microstructure of the product film also becomes difficult, and compact deposition of the MgO film component onto the substrate is inhibited, resulting in an undesirable decrease in the film density.

In a MgO vapor deposition material of the present invention, by forming polycrystalline pellets with a MgO purity of at least 99.0%, a relative density of at least 90.0%, and an average sulfur S content of 0.01 to 50 ppm, the level of splash occurrence can be reduced and the protective film characteristics can be improved relative to the case of single crystal pellets. This finding is due to the following discoveries made by the inventors of the present invention.

Splash particles from single crystal MgO are scale-shaped, and it is surmised that these are generated by cleavage occurring at crystal planes. In contrast, in the case of polycrystalline MgO, the splash particles are of irregular shape, and it is thought that these are generated by rupture at crystal grain boundaries. In addition, because polycrystals display a higher brittleness than single crystals, even if micro cracks are generated within the material, these do not immediately result in splash. In other words, it is thought that the above finding is due to the fact that compared with single crystal MgO, polycrystalline MgO pellets are able to provide a reduction in the frequency with which the pellets themselves undergo splitting.

In a MgO vapor deposition material of the present invention, by forming polycrystalline pellets with a MgO purity of at least 99.0%, a relative density of at least 90.0%, and an average chlorine Cl content of 0.01 to 50 ppm, the level of splash occurrence can be reduced and the protective film characteristics can be improved relative to the case of single crystal pellets. This finding is due to the discoveries described above made by the inventors of the present invention.

In a MgO vapor deposition material of the present invention, by forming polycrystalline pellets with a MgO purity of at least 99.0%, a relative density of at least 90.0%, and an average nitrogen N content of 0.01 to 200 ppm, the level of splash occurrence can be reduced and the protective film characteristics can be improved relative to the case of single crystal pellets. This finding is due to the discoveries described above made by the inventors of the present invention.

In a MgO vapor deposition material of the present invention, by forming polycrystalline pellets with a MgO purity of at least 99.0%, a relative density of at least 90.0%, and an average phosphorus P content of 0.01 to 30 ppm, the level of splash occurrence can be reduced and the protective film characteristics can be improved relative to the case of single crystal pellets. This finding is due to the discoveries described above made by the inventors of the present invention.

Furthermore in the present invention, by ensuring that the above polycrystals comprise a granular portion (crystal grain portion) with a low sulfur S content, and a grain boundary portion with a higher sulfur S content than the granular portion, the level of splash occurrence can be reduced and the protective film characteristics can be improved. This finding is due to the following discoveries made by the inventors of the present invention.

Based on the various analysis results from the examples described below it was evident that the sulfur S that represents a gasification component in single crystal pellets is dispersed essentially uniformly throughout the pellets, whereas in polycrystalline pellets, the sulfur S that represents a gasification component is concentrated within the surface of the granular portion (the grain boundary section) and the pellet surface.

In other words, it is thought that in those cases in which the sulfur S that represents one gasification component, which gasifies and causes a volumetric expansion when heated, is concentrated within the interior of a material, this gasification component undergoes a volumetric expansion upon heating during electron beam vapor deposition or the like, and this volumetric expansion generates micro cracking in the pellet, with this micro cracking then acting as the trigger for causing the splash phenomenon.

Furthermore in the present invention, by ensuring that the above polycrystals comprise a granular portion (crystal grain portion) with a low chlorine Cl content, and a grain boundary portion with a higher chlorine Cl content than the granular portion, the level of splash occurrence can be reduced and the protective film characteristics can be improved. This finding is due to the following discoveries made by the inventors of the present invention.

Based on the various analysis results from the examples described below it was evident that the chlorine Cl that represents a gasification component in single crystal pellets is dispersed essentially uniformly throughout the pellets, whereas in polycrystalline pellets, the chlorine Cl that represents a gasification component is concentrated within the surface of the granular portion (the grain boundary section) and the pellet surface.

In other words, it is thought that in those cases in which the chlorine Cl that represents one gasification component, which gasifies and causes a volumetric expansion when heated, is concentrated within the interior of a material, this gasification component undergoes a volumetric expansion upon heating during electron beam vapor deposition or the like, and this volumetric expansion generates micro cracking in the pellet, with this micro cracking then acting as the trigger for causing the splash phenomenon.

Furthermore in the present invention, by ensuring that the above polycrystals comprise a granular portion (crystal grain portion) with a low nitrogen N content, and a grain boundary portion with a higher nitrogen N content than the granular portion, the level of splash occurrence can be reduced and the protective film characteristics can be improved. This finding is due to the following discoveries made by the inventors of the present invention.

Based on the various analysis results from the examples described below it was evident that the nitrogen N that represents a gasification component in single crystal pellets is dispersed essentially uniformly throughout the pellets, whereas in polycrystalline pellets, the nitrogen N that represents a gasification component is concentrated within the surface of the granular portion (the grain boundary section) and the pellet surface.

In other words, it is thought that in those cases in which the nitrogen N that represents one gasification component, which gasifies and causes a volumetric expansion when heated, is concentrated within the interior of a material, this gasification component undergoes a volumetric expansion upon heating during electron beam vapor deposition or the like, and this volumetric expansion generates micro cracking in the pellet, with this micro cracking then acting as the trigger for causing the splash phenomenon.

Furthermore in the present invention, by ensuring that the above polycrystals comprise a granular portion (crystal grain portion) with a low phosphorus P content, and a grain boundary portion with a higher phosphorus P content than the granular portion, the level of splash occurrence can be reduced and the protective film characteristics can be improved. This finding is due to the following discoveries made by the inventors of the present invention.

Based on the various analysis results from the examples described below it was evident that the phosphorus P that represents a gasification component in single crystal pellets is dispersed essentially uniformly throughout the pellets, whereas in polycrystalline pellets, the phosphorus P that represents a gasification component is concentrated within the surface of the granular portion (the grain boundary section) and the pellet surface.

In other words, it is thought that in those cases in which the phosphorus P that represents one gasification component, which gasifies and causes a volumetric expansion when heated, is concentrated within the interior of a material, this gasification component undergoes a volumetric expansion upon heating during electron beam vapor deposition or the like, and this volumetric expansion generates micro cracking in the pellet, with this micro cracking then acting as the trigger for causing the splash phenomenon.

Because polycrystals display a higher brittleness than single crystals, even if micro cracks are generated within a polycrystalline material, these do not immediately result in splash. Furthermore, it is surmised that because the micro cracking generates a path through which the gasification component can escape, this further reduces the likelihood of splash occurrence. It is thought that this is why the quantity of splash is lower in polycrystals than in single crystals.

The inventors of the present invention discovered that employing a ratio between the respective sulfur S contents within the aforementioned granular portion and the aforementioned grain boundary portion that is greater than 5 was effective in further suppressing the level of splash.

They also discovered that employing a ratio between the respective chlorine Cl contents within the aforementioned granular portion and the aforementioned grain boundary portion that is greater than 5 was effective in further suppressing the level of splash.

They also discovered that employing a ratio between the respective nitrogen N contents within the aforementioned granular portion and the aforementioned grain boundary portion that is greater than 5 was effective in further suppressing the level of splash.

They also discovered that employing a ratio between the respective phosphorus P contents within the aforementioned granular portion and the aforementioned grain boundary portion that is greater than 5 was effective in further suppressing the level of splash.

In addition, as described above, the ratio between the respective sulfur S contents within the granular portion and the grain boundary portion is preferably set to a value greater than 5.

If the ratio between the respective sulfur S contents within the aforementioned two portions is less than 5, then the quantity of sulfur S that represents a gasification component in the granular portion becomes overly large, and the difference between the respective sulfur S contents within the granular portion and the grain boundary portion decreases, causing an undesirable reduction in the merit gained by ensuring an uneven distribution of the gasification component, namely a reduction in the merit gained by generating paths in the grain boundary portion through which the gasification component can escape during heating, thus reducing splash occurrence. Furthermore, the total sulfur S content within the pellets also increases, which is undesirable as it makes reductions in splash occurrence difficult to achieve.

In addition, as described above, the ratio between the respective chlorine Cl contents within the granular portion and the grain boundary portion is preferably set to a value greater than 5.

If the ratio between the respective chlorine Cl contents within the aforementioned two portions is less than 5, then the quantity of chlorine Cl that represents a gasification component in the granular portion becomes overly large, and the difference between the respective chlorine Cl contents within the granular portion and the grain boundary portion decreases, causing an undesirable reduction in the merit gained by ensuring an uneven distribution of the gasification component, namely a reduction in the merit gained by generating paths in the grain boundary portion through which the gasification component can escape during heating, thus reducing splash occurrence. Furthermore, the total chlorine Cl content within the pellets also increases, which is undesirable as it makes reductions in splash occurrence difficult to achieve.

In addition, as described above, the ratio between the respective nitrogen N contents within the granular portion and the grain boundary portion is preferably set to a value greater than 5.

If the ratio between the respective nitrogen N contents within the aforementioned two portions is less than 5, then the quantity of nitrogen N that represents a gasification component in the granular portion becomes overly large, and the difference between the respective nitrogen N contents within the granular portion and the grain boundary portion decreases, causing an undesirable reduction in the merit gained by ensuring an uneven distribution of the gasification component, namely a reduction in the merit gained by generating paths in the grain boundary portion through which the gasification component can escape during heating, thus reducing splash occurrence. Furthermore, the total nitrogen N content within the pellets also increases, which is undesirable as it makes reductions in splash occurrence difficult to achieve.

In addition, as described above, the ratio between the respective phosphorus P contents within the granular portion and the grain boundary portion is preferably set to a value greater than 5.

If the ratio between the respective phosphorus P contents within the aforementioned two portions is less than 5, then the quantity of phosphorus P that represents a gasification component in the granular portion becomes overly large, and the difference between the respective phosphorus P contents within the granular portion and the grain boundary portion decreases, causing an undesirable reduction in the merit gained by ensuring an uneven distribution of the gasification component, namely a reduction in the merit gained by generating paths in the grain boundary portion through which the gasification component can escape during heating, thus reducing splash occurrence. Furthermore, the total phosphorus P content within the pellets also increases, which is undesirable as it makes reductions in splash occurrence difficult to achieve.

In addition, in the present invention, the sulfur S content within the aforementioned granular portion of the MgO can be restricted to less than 0.01 atom %, and the sulfur S content within the aforementioned grain boundary portion can be restricted to approximately 0.03 atom %.

These values for the granular portion and the grain boundary portion were determined by component analysis across a polycrystal cross section performed using TEM-EDX (shape observation using a transmission electron microscope). Furthermore for reference purposes, the state of the sulfur S was measured using ESCA (Electron Spectroscopy for Chemical Analysis, or XPS; X-ray Photoelectron Spectroscopy), both for the outermost surface of the sample, and the interior of the sample exposed by argon ion sputter etching. ESCA analysis involves irradiating a sample with X-rays, and measuring the energy of the radiated electrons.

Furthermore, the average quantity of sulfur S within the sample was determined by subjecting the sample to high frequency melting, and then measuring the infrared absorption of the $SO_2$ gas discharged upon melting.

In addition, in the present invention, the chlorine Cl content within the aforementioned granular portion of the MgO can be restricted to no more than 0.002 atom %, and the chlorine Cl content within the aforementioned grain boundary portion can be restricted to approximately 0.01 atom %.

These values for the granular portion and the grain boundary portion were determined by component analysis across a polycrystal cross section performed using TEM-EDX. Furthermore for reference purposes, the state of the chlorine Cl was measured using ESCA, both for the outermost surface of the sample, and the interior of the sample exposed by argon ion sputter etching.

Furthermore, the average quantity of chlorine Cl within the sample was determined by subjecting the sample to high frequency melting, trapping the chlorine gas that was discharged upon melting, measuring the spectral transmittance of the aqueous solution using a spectrophotometer, and using this value to calculate the quantity of chlorine.

In addition, in the present invention, the nitrogen N content within the aforementioned granular portion of the MgO can be restricted to no more than 0.02 atom %, and the nitrogen N content within the aforementioned grain boundary portion can be restricted to approximately 0.14 atom %.

These values for the granular portion and the grain boundary portion were determined by component analysis across a polycrystal cross section performed using TEM-EDX. Furthermore for reference purposes, the state of the nitrogen N was measured using ESCA, both for the outermost surface of the sample, and the interior of the sample exposed by argon ion sputter etching.

Furthermore, the average quantity of nitrogen N within the sample was determined by subjecting the sample to high frequency melting, and then measuring the thermal conductivity of the $NO_2$ gas discharged upon melting.

In addition, in the present invention, the phosphorus P content within the aforementioned granular portion of the MgO can be restricted to no more than 0.003 atom %, and the phosphorus P content within the aforementioned grain boundary portion can be restricted to approximately 0.04 atom %.

These values for the granular portion and the grain boundary portion were determined by component analysis across a polycrystal cross section performed using TEM-EDX. Furthermore for reference purposes, the state of the phosphorus P was measured using ESCA, both for the outermost surface of the sample, and the interior of the sample exposed by argon ion sputter etching.

Furthermore, the average quantity of phosphorus P within the sample was determined by subjecting the sample to high frequency melting, and then measuring the thermal conductivity of the $PO_2$ gas discharged upon melting.

The thickness of the grain boundary portion is preferably within a range from 1 to 200 nm. By employing such a thickness, when the sulfur S, chlorine Cl, nitrogen N and phosphorus P gasification components undergo volumetric expansion upon heating, paths can be formed which allow these gasification components to readily escape from the pellets, enabling a further reduction in the likelihood of splash occurrence.

At this point, if the thickness of the grain boundary portion is set to a value less than 1 nm, then a grain boundary portion with comparatively high concentrations of the sulfur S, chlorine Cl, nitrogen N and phosphorus P gasification components cannot be formed satisfactorily, and consequently the gasification components cannot readily escape upon heating, resulting in an undesirable increase in splash occurrence. Furthermore, if the thickness of the grain boundary portion is set to a value exceeding 200 nm, then the respective quantities of the sulfur S, chlorine Cl, nitrogen N and phosphorus P gasification components become overly high, causing an undesirable increase in splash occurrence.

In addition, the present invention may consist of polycrystalline pellets with an average crystal grain diameter of 1 to 500 µm formed from the sintered MgO described above, comprising rounded air pockets with an average diameter of no more than 10 µm inside the crystal grains of the sintered pellets. In this type of MgO vapor deposition material, the sintered pellets of the polycrystalline MgO have a finely detailed crystalline structure, and the occurrence of defects at the crystal grain boundaries can be reduced, meaning the formed MgO film displays superior film characteristics.

Furthermore the present invention may comprise polycrystalline pellets formed from sintered polycrystalline MgO, in which the elemental concentration of Si is no more than 5000 ppm, the elemental concentration of Al impurities is no more than 300 ppm, the elemental concentration of Ca impurities is no more than 2000 ppm, the elemental concentration of Fe impurities is no more than 400 ppm, the elemental concentrations of Cr, V and Ni impurities are each no more than 50 ppm, the elemental concentrations of Na and K impurities are each no more than 30 ppm, the elemental concentration of C impurities is no more than 300 ppm, and the elemental concentration of Zr impurities is no more than 150 ppm. In this type of MgO vapor deposition material, the quantities of impurities contained within the formed MgO film are extremely low, meaning the film characteristics of the MgO film can be further improved.

In a production process for a MgO vapor deposition material according to the present invention, by using a MgO powder with a sulfur S content of 0.01 to 50 ppm as the raw material, the type of MgO vapor deposition material described above can be produced.

In a production process for a MgO vapor deposition material according to the present invention, by using a MgO powder with a chlorine Cl content of 0.01 to 50 ppm as the raw material, the type of MgO vapor deposition material described above can be produced.

In a production process for a MgO vapor deposition material according to the present invention, by using a MgO powder with a nitrogen N content of 0.01 to 200 ppm as the raw material, the type of MgO vapor deposition material described above can be produced.

In a production process for a MgO vapor deposition material according to the present invention, by using a MgO powder with a phosphorus P content of 0.01 to 30 ppm as the raw material, the type of MgO vapor deposition material described above can be produced.

Furthermore, the present invention may utilize a MgO powder with a purity of at least 99.0%, a relative density of at least 90.0%, a sulfur S content of 0.01 to 50 ppm, and an average grain diameter of 0.1 to 5 µm as the raw material, and may comprise a step for preparing a slurry with a concentration of 45 to 75% by weight by mixing the raw material powder, a binder and an organic solvent, a step for spray drying the slurry to generate a granulated powder with an average grain diameter of 50 to 300 µm, a step for placing the granulated powder in a predetermined mold and molding the powder at a predetermined pressure, and a step for sintering the molded product at a predetermined temperature. The step for generating a granulated powder may also use a typical rolling granulation method.

At this time, the treatment for desulfurization of the raw material MgO powder involves combining the MgO powder and water to generate a $Mg(OH)_2$ solution, separating the sulfur S component as $MgSO_4$, and then sintering the remaining solution in the atmosphere to remove the water component. This process enables the production of a desulfurized MgO powder with an average sulfur S content of 0.01 to 50 ppm.

Here, the average sulfur S content refers to the average value for the sulfur S content within an entire pellet, and the respective sulfur S contents within the granular portion and the grain boundary portion are different.

When a polycrystalline MgO vapor deposition material is produced using this process, a MgO vapor deposition material comprising polycrystalline pellets of sintered MgO with a MgO purity of at least 99.0%, a relative density of at least 90.0%, and a sulfur S content of 0.01 to 50 ppm can be obtained.

Furthermore, the present invention may utilize a MgO powder with a purity of at least 99.0%, a relative density of at least 90.0%, a chlorine Cl content of 0.01 to 50 ppm, and an average grain diameter of 0.1 to 5 µm as the raw material, and may comprise a step for preparing a slurry with a concentration of 45 to 75% by weight by mixing the raw material powder, a binder and an organic solvent, a step for spray drying the slurry to generate a granulated powder with an average grain diameter of 50 to 300 µm, a step for placing the granulated powder in a predetermined mold and molding the powder at a predetermined pressure, and a step for sintering the molded product at a predetermined temperature. The step for generating a granulated powder may also use a typical rolling granulation method.

At this time, the treatment for dechlorination of the raw material MgO powder involves combining the MgO powder and water to generate a $Mg(OH)_2$ solution, separating the chlorine Cl component as $MgCl_2$, and then sintering the remaining solution in the atmosphere to remove the water component. This process enables the production of a dechlorinated MgO powder with an average chlorine Cl content of 0.01 to 50 ppm.

Here, the average chlorine Cl content refers to the average value for the chlorine Cl content within an entire pellet, and the respective chlorine Cl contents within the granular portion and the grain boundary portion are different.

When a polycrystalline MgO vapor deposition material is produced using this process, a MgO vapor deposition material comprising sintered pellets of MgO with a MgO purity of at least 99.0%, a relative density of at least 90.0%, and a chlorine Cl content of 0.01 to 50 ppm can be obtained.

Furthermore, the present invention may utilize a MgO powder with a purity of at least 99.0%, a relative density of at least 90.0%, a nitrogen N content of 0.01 to 200 ppm, and an average grain diameter of 0.1 to 5 µm as the raw material, and may comprise a step for preparing a slurry with a concentration of 45 to 75% by weight by mixing the raw material powder, a binder and an organic solvent, a step for spray drying the slurry to generate a granulated powder with an average grain diameter of 50 to 300 µm, a step for placing the granulated powder in a predetermined mold and molding the powder at a predetermined pressure, and a step for sintering the molded product at a predetermined temperature. The step for generating a granulated powder may also use a typical rolling granulation method.

At this time, the treatment for denitrification of the raw material MgO powder involves subjecting the MgO powder to heating under vacuum to effect denitrification, and enables the production of a denitrified MgO powder with a reduced average nitrogen N content.

Here, the average nitrogen N content refers to the average value for the nitrogen N content within an entire pellet, and the respective nitrogen N contents within the granular portion and the grain boundary portion are different.

When a polycrystalline MgO vapor deposition material is produced using this process, a MgO vapor deposition material comprising polycrystalline pellets of sintered MgO with a MgO purity of at least 99.0%, a relative density of at least 90.0%, and a nitrogen N content of 0.01 to 200 ppm can be obtained.

Furthermore, the present invention may utilize a MgO powder with a purity of at least 99.0%, a relative density of at least 90.0%, a phosphorus P content of 0.01 to 30 ppm, and an average grain diameter of 0.1 to 5 μm as the raw material, and may comprise a step for preparing a slurry with a concentration of 45 to 75% by weight by mixing the raw material powder, a binder and an organic solvent, a step for spray drying the slurry to generate a granulated powder with an average grain diameter of 50 to 300 μm, a step for placing the granulated powder in a predetermined mold and molding the powder at a predetermined pressure, and a step for sintering the molded product at a predetermined temperature. The step for generating a granulated powder may also use a typical rolling granulation method.

At this time, the treatment for dephosphorylation of the raw material MgO powder involves subjecting the MgO powder to heating under vacuum to effect dephosphorylation, and enables the production of a dephosphorylated MgO powder with a reduced average phosphorus P content.

Here, the average phosphorus P content refers to the average value for the phosphorus P content within an entire pellet, and the respective phosphorus P contents within the granular portion and the grain boundary portion are different.

When a polycrystalline MgO vapor deposition material is produced using this process, a MgO vapor deposition material comprising polycrystalline pellets of sintered MgO with a MgO purity of at least 99.0%, a relative density of at least 90.0%, and a phosphorus P content of 0.01 to 30 ppm can be obtained.

In addition, the granulated powder is preferably subjected to either uniaxial pressure molding at a pressure of 750 to 2000 kg/cm$^2$, or CIP molding at a pressure of 1000 to 3000 kg/cm$^2$. Furthermore, the molded product is preferably first subjected to primary sintering at a temperature of 1250 to 1350° C., and the temperature then raised and a secondary sintering performed at a temperature of 1500 to 1700° C.

BEST MODE FOR CARRYING OUT THE INVENTION

Figure 1:
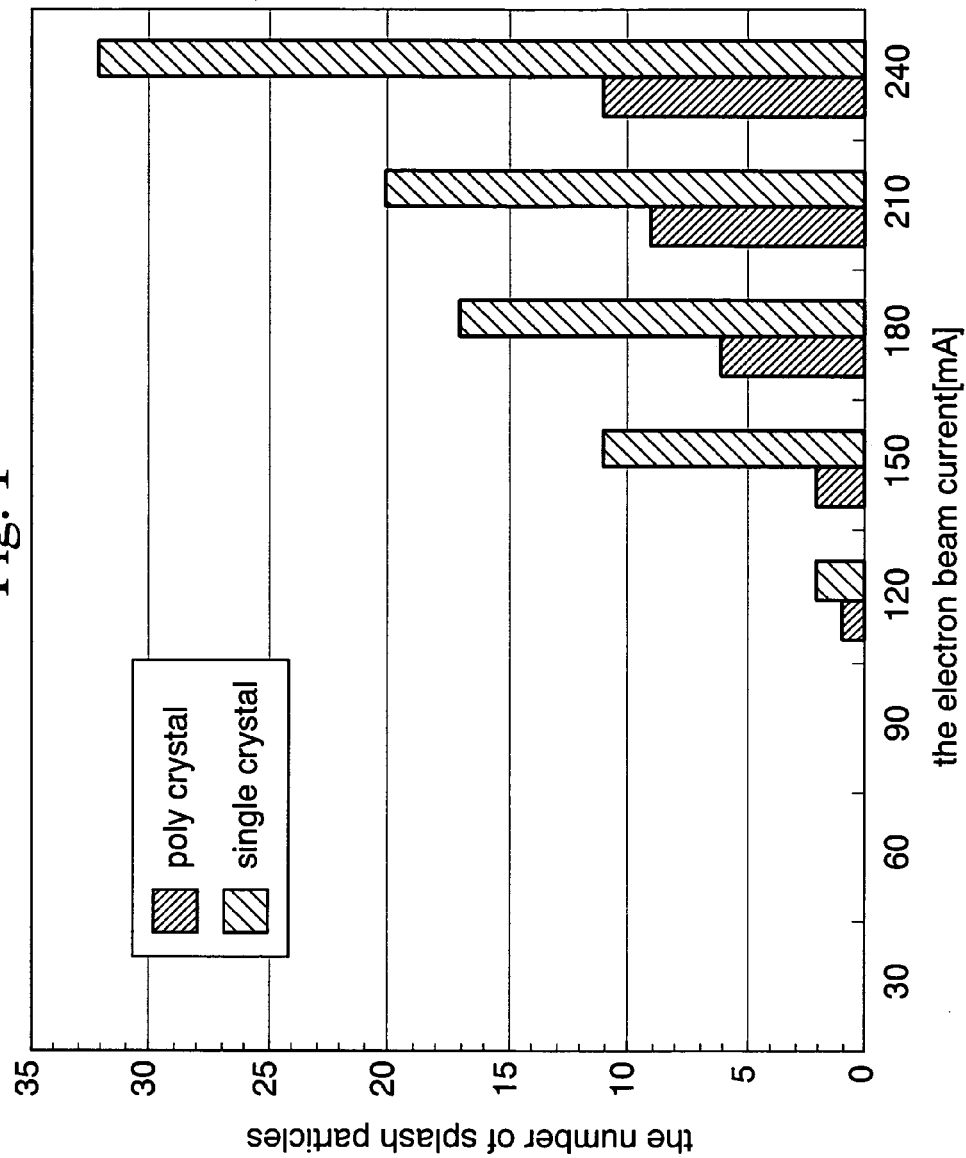
FIG. 1 is a graph of electron beam current versus the number of splash particles, and represents the results of splash tests for examples of the MgO vapor deposition material according to the present invention and the production process therefor.

As follows is a detailed description of a first embodiment of a MgO vapor deposition material according to the present invention and a production process therefor.

A MgO vapor deposition material of this embodiment comprises sintered pellets of polycrystalline MgO with an average sulfur S content of 0.01 to 50 ppm, an average chlorine Cl content of 0.01 to 50 ppm, an average nitrogen N content of 0.01 to 200 ppm and an average phosphorus P content of 0.01 to 30 ppm, as well as a MgO purity of at least 99.0%, and preferably at least 99.5%, and even more preferably at least 99.9%, and a relative density of at least 90%, and preferably at least 97%, and even more preferably at least 98%. Furthermore the average crystal grain diameter of the sintered pellets is from 1 to 500 μm, and the crystal grains of the sintered polycrystalline pellets contain rounded air pockets with an average internal diameter of no more than 10 μm.

If the sulfur S content is set to a value of less than 0.01 ppm, then the strength of the vapor deposition material is inadequate, whereas if the sulfur S content is set to a value greater than 50 ppm, then during film formation by either electron beam deposition or ion plating, not only does the level of vapor deposition material splash occurrence increase, which causes a reduction in the degree of efficiency with which the quantity of vapor deposition material can be used in the film formation process, resulting in an increase in material costs, but control of the crystal orientation and microstructure of the product film also becomes difficult, and compact deposition of the MgO film component onto the substrate is inhibited, resulting in an undesirable decrease in the film density.

If the chlorine Cl content is set to a value less than 0.01 ppm, then the strength of the vapor deposition material is inadequate, whereas if the chlorine Cl content is set to a value greater than 50 ppm, then during film formation by either electron beam deposition or ion plating, not only does the level of vapor deposition material splash occurrence increase, which causes a reduction in the degree of efficiency with which the quantity of vapor deposition material can be used in the film formation process, resulting in an increase in material costs, but control of the crystal orientation and microstructure of the product film also becomes difficult, and compact deposition of the MgO film component onto the substrate is inhibited, resulting in an undesirable decrease in the film density.

If the nitrogen N content is set to a value less than 0.01 ppm, then the strength of the vapor deposition material is inadequate, whereas if the nitrogen N content is set to a value greater than 200 ppm, then during film formation by either electron beam deposition or ion plating, not only does the level of vapor deposition material splash occurrence increase, which causes a reduction in the degree of efficiency with which the quantity of vapor deposition material can be used in the film formation process, resulting in an increase in material costs, but control of the crystal orientation and microstructure of the product film also becomes difficult, and compact deposition of the MgO film component onto the substrate is inhibited, resulting in an undesirable decrease in the film density.

If the phosphorus P content is set to a value less than 0.01 ppm, then the strength of the vapor deposition material is inadequate, whereas if the phosphorus P content is set to a value greater than 30 ppm, then during film formation by either electron beam deposition or ion plating, not only does the level of vapor deposition material splash occurrence increase, which causes a reduction in the degree of efficiency with which the quantity of vapor deposition material can be used in the film formation process, resulting in an increase in material costs, but control of the crystal orientation and microstructure of the product film also becomes difficult, and compact deposition of the MgO film component onto the substrate is inhibited, resulting in an undesirable decrease in the film density.

Furthermore, the reason that the average crystal grain diameter of the polycrystalline pellets of sintered material is set to a value within a range from 1 to 500 μm is that grain diameters within this range enable better control of the MgO structure. Furthermore, the reason that the average internal diameter of the air pockets inside the crystal grains of the sintered pellets is set to a value of no more than 10 μm is that if this value exceeds 10 μm, control of the MgO structure becomes difficult.

The polycrystalline pellets of sintered material comprise a granular portion (crystal grain portion) with low concentrations of sulfur S, chlorine Cl, nitrogen N and phosphorus P gasification components, and a grain boundary portion, which is formed around the periphery of the granular portion (crystal grain portion) and has higher concentrations of sulfur S, chlorine Cl, nitrogen N and phosphorus P gasification components than the granular portion.

Specifically, the sulfur S content within the granular portion is preferably within a range from 0.000001 to 0.005 atom %, and the sulfur S content within the grain boundary portion is preferably within a range from 0.01 to 0.1 atom %.

Furthermore, the chlorine Cl content within the granular portion is preferably within a range from 0.000001 to 0.003 atom %, and the chlorine Cl content within the grain boundary portion is preferably within a range from 0.005 to 0.1 atom %.

Furthermore, the nitrogen N content within the granular portion is preferably within a range from 0.000001 to 0.03 atom %, and the nitrogen N content within the grain boundary portion is preferably within a range from 0.01 to 0.2 atom %.

Furthermore, the phosphorus P content within the granular portion is preferably within a range from 0.000001 to 0.003 atom %, and the phosphorus P content within the grain boundary portion is preferably within a range from 0.001 to 0.05 atom %.

If the sulfur S content within the granular portion is not set within the above range from 0.000001 to 0.005 atom %, then the average sulfur S content increases, splash occurrence becomes much more severe, and the desulfurization treatment of the raw material becomes significantly longer, meaning large potential increases in production costs.

Furthermore, if the sulfur S content within the grain boundary portion is not set within the range from 0.01 to 0.1 atom %, then the splash reduction effect is unsatisfactory.

If the chlorine Cl content within the granular portion is not set within the above range from 0.000001 to 0.003 atom %, then the average chlorine Cl content increases, splash occurrence becomes much more severe, and the dechlorination treatment of the raw material becomes significantly longer, meaning large potential increases in production costs.

Furthermore, if the chlorine Cl content within the grain boundary portion is not set within the range from 0.005 to 0.1 atom %, then the splash reduction effect is unsatisfactory.

If the nitrogen N content within the granular portion is not set within the above range from 0.000001 to 0.03 atom %, then the average nitrogen N content increases, splash occurrence becomes much more severe, and the denitrification treatment of the raw material becomes significantly longer, meaning large potential increases in production costs.

Furthermore, if the nitrogen N content within the grain boundary portion is not set within the range from 0.01 to 0.2 atom %, then the splash reduction effect is unsatisfactory.

If the phosphorus P content within the granular portion is not set within the above range from 0.000001 to 0.003 atom %, then the average phosphorus P content increases, splash occurrence becomes much more severe, and the dephosphorylation treatment of the raw material becomes significantly longer, meaning large potential increases in production costs.

Furthermore, if the phosphorus P content within the grain boundary portion is not set within the range from 0.001 to 0.05 atom %, then the splash reduction effect is unsatisfactory.

Furthermore, as described above, the ratio between the respective sulfur S contents within the granular portion and the grain boundary portion is preferably set to a value greater than 5.

If the above ratio between the respective sulfur S contents within the two portions is less than 5, then the quantity of the sulfur S gasification component within the granular portion becomes overly large, and the difference between the respective sulfur S contents within the granular portion and the grain boundary portion decreases, causing an undesirable reduction in the merit gained by ensuring an uneven distribution of the gasification component, namely a reduction in the merit gained by generating paths in the grain boundary portion through which the gasification component can escape during heating, thus reducing splash occurrence. Furthermore, the total sulfur S content within the pellets also increases, which is undesirable as it makes reductions in splash occurrence difficult to achieve.

Furthermore, in those cases in which the above ratio between the respective sulfur S contents is smaller than the aforementioned value, and the average sulfur S content is not restricted, there is a possibility that the escape of the gasification component from the pellets, which is thought to occur along the grain boundary portions, will be inhibited, thus causing the generation of micro cracks as the gasification component undergoes volumetric expansion, and causing a potential undesirable increase in the splash occurrence.

Furthermore, as described above, the ratio between the respective chlorine Cl contents within the granular portion and the grain boundary portion is preferably set to a value greater than 5.

If the above ratio between the respective chlorine Cl contents within the two portions is less than 5, then the quantity of the chlorine Cl gasification component within the granular portion becomes overly large, and the difference between the respective chlorine Cl contents within the granular portion and the grain boundary portion decreases, causing an undesirable reduction in the merit gained by ensuring an uneven distribution of the gasification component, namely a reduction in the merit gained by generating paths in the grain boundary portion through which the gasification component can escape during heating, thus reducing splash occurrence. Furthermore, the total chlorine Cl content within the pellets also increases, which is undesirable as it makes reductions in splash occurrence difficult to achieve.

Furthermore, in those cases in which the above ratio between the respective chlorine Cl contents is smaller than the aforementioned value, and the average chlorine Cl content is not restricted, there is a possibility that the escape of the gasification component from the pellets, which is thought to occur along the grain boundary portions, will be inhibited, thus causing the generation of micro cracks as the gasification component undergoes volumetric expansion, and causing a potential undesirable increase in the splash occurrence.

Furthermore, as described above, the ratio between the respective nitrogen N contents within the granular portion and the grain boundary portion is preferably set to a value greater than 5.

If the above ratio between the respective nitrogen N contents within the two portions is less than 5, then the quantity of the nitrogen N gasification component within the granular portion becomes overly large, and the difference between the respective nitrogen N contents within the granular portion and the grain boundary portion decreases, causing an undesirable reduction in the merit gained by ensuring an uneven distribution of the gasification component, namely a reduction in the merit gained by generating paths in the grain boundary portion through which the gasification component can escape during heating, thus reducing splash occurrence. Furthermore, the total nitrogen N content within the pellets also increases, which is undesirable as it makes reductions in splash occurrence difficult to achieve.

Furthermore, in those cases in which the above ratio between the respective nitrogen N contents is smaller than the aforementioned value, and the average nitrogen N content is not restricted, there is a possibility that the escape of the gasification component from the pellets, which is thought to occur along the grain boundary portions, will be inhibited, thus causing the generation of micro cracks as the gasification component undergoes volumetric expansion, and causing a potential undesirable increase in the splash occurrence.

Furthermore, as described above, the ratio between the respective phosphorus P contents within the granular portion and the grain boundary portion is preferably set to a value greater than 5.

If the above ratio between the respective phosphorus P contents within the two portions is less than 5, then the quantity of the phosphorus P gasification component within the granular portion becomes overly large, and the difference between the respective phosphorus P contents within the granular portion and the grain boundary portion decreases, causing an undesirable reduction in the merit gained by ensuring an uneven distribution of the gasification component, namely a reduction in the merit gained by generating paths in the grain boundary portion through which the gasification component can escape during heating, thus reducing splash occurrence. Furthermore, the total phosphorus P content within the pellets also increases, which is undesirable as it makes reductions in splash occurrence difficult to achieve.

Furthermore, in those cases in which the above ratio between the respective phosphorus P contents is smaller than the aforementioned value, and the average phosphorus P content is not restricted, there is a possibility that the escape of the gasification component from the pellets, which is thought to occur along the grain boundary portions, will be inhibited, thus causing the generation of micro cracks as the gasification component undergoes volumetric expansion, and causing a potential undesirable increase in the splash occurrence.

The thickness of the grain boundary portion is preferably within a range from 1 to 200 nm. At this point, if the thickness of the grain boundary portion is set to a value less than 1 nm, then a grain boundary portion with comparatively high concentrations of the sulfur S, chlorine Cl, nitrogen N and phosphorus P gasification components cannot be formed satisfactorily, and consequently the gasification components cannot readily escape upon heating, resulting in an undesirable increase in splash occurrence. Furthermore, if the thickness of the grain boundary portion is set to a value exceeding 200 nm, then the respective quantities of the sulfur S, chlorine Cl, nitrogen N and phosphorus P gasification components become overly high, causing an undesirable increase in splash occurrence.

The total quantity of impurities (Si, Al, Ca, Fe, Cr, V, Ni, Na, K, C and Zr) within the sintered pellets of polycrystalline MgO is preferably no more than 10,000 ppm. Furthermore, the individual quantities of each of the above impurities are preferably restricted to an elemental concentration of Si of no more than 5000 ppm, an elemental concentration of Al of no more than 300 ppm, an elemental concentration of Ca of no more than 2000 ppm, an elemental concentration of Fe of no more than 400 ppm, elemental concentrations of each of Cr, V and Ni of no more than 50 ppm, elemental concentrations of each of Na and K of no more than 30 ppm, an elemental concentration of C of no more than 300 ppm, and an elemental concentration of Zr of no more than 150 ppm. If the elemental concentrations of the above impurities exceed the respective values listed above, then when a glass substrate with a film of the MgO vapor deposition material formed thereon by electron beam deposition is integrated into a panel, variations develop in the film quality, causing electrical problems such as an increase or instability in the drive voltage.

As follows is a description of a production process for a MgO vapor deposition material described above.

First, a degasified MgO powder with gasification components including a sulfur S content of 0.01 to 50 ppm, a chlorine Cl content of 0.01 to 50 ppm, a nitrogen N content of 0.01 to 200 ppm, and a phosphorus P content of 0.01 to 30 ppm is prepared from a MgO powder with a purity of at least 99.0%.

Here, the treatments for desulfurization and dechlorination involve combining the MgO powder and water to generate a $Mg(OH)_2$ solution, separating the sulfur S component as $MgSO_4$ and the chlorine Cl component as $MgCl_2$, and then sintering the remaining solution in the atmosphere to remove the water component, thus forming a desulfurized and dechlorinated MgO powder with a low sulfur S content and a low chlorine Cl content.

At the same time, the treatments for denitrification and dephosphorylation involve subjecting the desulfurized and dechlorinated MgO powder to heating under vacuum to effect denitrification and dephosphorylation, thus forming a degasified MgO powder with a low nitrogen N content and low phosphorus P content.

Specifically, the denitrification and dephosphorylation heat treatment involves heating at 330 to 500° C. for a period of 0.1 to 2 hours.

This degasified MgO powder with gasification components including a sulfur S content of 0.01 to 50 ppm, a chlorine Cl content of 0.01 to 50 ppm, a nitrogen N content of 0.01 to 200 ppm, and a phosphorus P content of 0.01 to 30 ppm is combined with a binder and an organic solvent to prepare a slurry with a concentration of 45 to 75% by weight. The reason for restricting the concentration of the slurry to a value within the range from 45 to 75% by weight is because if the concentration exceeds 75% by weight, then because the slurry is a non-aqueous system stable granulation becomes difficult, whereas if the concentration is less than 45% by weight, a compact MgO sintered material with a uniform structure cannot be obtained. In other words, by restricting the slurry concentration to a value within the above range, the slurry viscosity falls within a range from 200 to 1000 cps, granulation of the powder using a spray dryer can conducted in a stable manner, and the density of the molded product can be increased, enabling the production of a compact sintered material.

Furthermore, the average grain diameter of the degasified MgO powder is preferably within a range from 0.1 to 5 μm. The reason for restricting the average grain diameter of the MgO powder to 0.1 to 5 μm is because at values less than 0.1 μm the powder becomes overly fine and agglomerates, causing a significant deterioration in the handling of the powder and making preparation of a high concentration slurry with a concentration of at least 45% by weight difficult, whereas if the average grain diameter exceeds 5 μm, then control of the microstucture becomes difficult, and producing compact sintered pellets becomes impossible. Furthermore, by restricting the average grain diameter of the MgO powder to a value within the above range, the desired sintered pellets can be obtained without the use of a sintering assistant. The binder is preferably polyethylene glycol or polyvinyl butyral or the like, and the organic solvent is preferably ethanol or propanol or the like. The binder is preferably added in a concentration of 0.2 to 2.5% by weight.

Wet mixing of the MgO powder, the binder and the organic solvent, and particularly wet mixing of the MgO powder and the organic solvent which functions as the dispersion medium is conducted using a wet ball mill or a stirring mill. In the case of a wet ball mill, if $ZrO_2$ balls are used, then a plurality of $ZrO_2$ balls with a diameter of 5 to 10 mm are used, and wet mixing is conducted for a period of 8 to 24 hours, and preferably from 20 to 24 hours. The reason for restricting the diameter of the $ZrO_2$ balls to 5 to 10 mm is because with balls smaller than 5 mm the mixing action is unsatisfactory, whereas if the ball size exceeds 10 mm, there is an increase in the quantity of impurities. Furthermore, the reason for employing a long mixing time of up to 24 hours is that impurity levels do not become a problem even if mixing is continued for a long period. If resin balls containing an iron core are used in the wet ball mill, then balls of diameter 10 to 15 mm are preferred.

In the case of a stirring mill, wet mixing is conducted for 0.5 to 1 hour using $ZrO_2$ balls of diameter 1 to 3 mm. The reason for restricting the diameter of the $ZrO_2$ balls to 1 to 3 mm is because with balls smaller than 1 mm the mixing action is unsatisfactory, whereas if the ball size exceeds 3 mm, there is an increase in the quantity of impurities. Furthermore, the reasons for employing a maximum mixing time of 1 hour are firstly, because if mixing is continued beyond 1 hour, then crushing of the raw materials occurs in addition to mixing, which can cause increases in the level of impurities, and secondly the fact that adequate mixing can be achieved within 1 hour.

Furthermore, mixing/granulation of the powder and the binder liquid can also be conducted using a typical rolling granulation method. This offers an advantage in that the process can be simplified, as the operation of separating the balls following the mixing process is unnecessary.

Subsequently, the slurry is spray dried to generate a granulated powder with an average grain diameter of 50 to 300 μm, and preferably from 50 to 200 μm, and this granulated powder is then placed in a desired mold, and molded under a predetermined pressure. The reason for restricting the average grain diameter to 50 to 300 μm is because at values less than 50 μm the moldability is poor, whereas if the diameter exceeds 300 μm then both the molded product density and the strength tend to be poor. The spray drying described above is preferably conducted using a spray dryer, and the predetermined mold uses either a uniaxial press apparatus or a CIP (Cold Isostatic Press) molding apparatus. In the case of a uniaxial press apparatus, the granulated powder is subjected to uniaxial pressure molding at a pressure of 750 to 2000 $kg/cm^2$, and preferably from 1000 to 1500 $kg/cm^2$, whereas in the case of a CIP molding apparatus, the granulated powder is subjected to CIP molding at a pressure of 1000 to 3000 $kg/cm^2$, and preferably from 1500 to 2000 $kg/cm^2$. The reasons for restricting the pressure to values within the above ranges are to enable an increase in the density of the molded product, prevent deformation following sintering, and remove the necessity for post-treatments.

The molded product is then sintered. Prior to sintering, the molded product is preferably subjected to a degreasing treatment at a temperature of 350 to 620° C. This degreasing treatment is conducted in order to prevent irregular coloring of the molded product following sintering, and should preferably be conducted thoroughly over a period of time. The sintering preferably consists of a two-stage sintering process comprising primary sintering at a temperature of 1250 to 1350° C. for a period of 1 to 5 hours, and subsequent secondary sintering at a raised temperature of 1500 to 1700° C. for a period of 1 to 10 hours.

When the temperature of the molded product is raised in order to conduct the primary sintering, sintering begins at 1200° C. and proceeds significantly at 1350° C. By conducting the primary sintering at this temperature, sintering irregularities (structural differences) do not occur between the grain surface and the grain interior even for large grain diameters, and by conducting the secondary sintering at a temperature of 1500 to 1700° C., sintered pellets with a relative density close to 100% can be achieved. Very small quantities of air pockets still exist in these sintered pellets, but these air pockets do not exist at the crystal grain boundaries where they could effect the characteristics of the MgO sintered product, but rather exist inside the crystal grains where they have almost no effect on the characteristics of the MgO sintered product. As a result, if these MgO sintered pellets with a sulfur S content according to the present invention, a chlorine Cl content according to the present invention, a nitrogen N content according to the present invention and a phosphorus P content according to the present invention are used for film formation within a plasma display panel, then splash occurrence is minimal, and a MgO film with favorable film characteristics can be obtained.

In those cases where a large molded product undergoes sintering, then by lowering the rate of temperature increase during the secondary sintering to 20 to 30° C./hour, an even more compact product can be obtained. Furthermore, in the case of sintering at normal pressure, a satisfactory increase in compactness cannot be achieved if the sintering temperature is less than 1500° C., whereas at sintering temperatures greater than 1500° C., a high density sintered product can be obtained, and consequently special sintering methods such as HIP (Hot Isostatic Press) methods or hot press methods need not be used.

In a MgO vapor deposition material according to the present embodiment and a production process therefor, by employing polycrystalline pellets with a MgO purity of at least 99.0%, a relative density of at least 90.0%, and an average sulfur S content of 0.01 to 50 ppm, when a MgO protective film for an AC type PDP or the like is formed using this MgO vapor deposition material, by either an electron beam deposition method or an ion plating method, the level of splash occurrence can be reduced and the protective film characteristics can be improved relative to the case of single crystal pellets.

In a MgO vapor deposition material according to the present embodiment and a production process therefor, by employing polycrystalline pellets with a MgO purity of at least 99.0%, a relative density of at least 90.0%, and an average chlorine Cl content of 0.01 to 50 ppm, when a MgO protective film for an AC type PDP or the like is formed using this MgO vapor deposition material, by either an electron beam deposition method or an ion plating method, the level of splash occurrence can be reduced and the protective film characteristics can be improved relative to the case of single crystal pellets.

In a MgO vapor deposition material according to the present embodiment and a production process therefor, by employing polycrystalline pellets with a MgO purity of at least 99.0%, a relative density of at least 90.0%, and an average nitrogen N content of 0.01 to 200 ppm, when a MgO protective film for an AC type PDP or the like is formed using this MgO vapor deposition material, by either an electron beam deposition method or an ion plating method, the level of splash occurrence can be reduced and the protective film characteristics can be improved relative to the case of single crystal pellets.

In a MgO vapor deposition material according to the present embodiment and a production process therefor, by employing polycrystalline pellets with a MgO purity of at least 99.0%, a relative density of at least 90.0%, and an average phosphorus P content of 0.01 to 30 ppm, when a MgO protective film for an AC type PDP or the like is formed using this MgO vapor deposition material, by either an electron beam deposition method or an ion plating method, the level of splash occurrence can be reduced and the protective film characteristics can be improved relative to the case of single crystal pellets.

It is thought that these findings are due to the fact that by using the settings described above, the gasification component can be reduced, thus reducing the occurrence of splash.

Accordingly, during film formation by either electron beam deposition or ion plating or the like, any increases in the level of splash occurrence of the vapor deposition material can be prevented, and as a result, decreases in the degree of efficiency with which the quantity of vapor deposition material can be used in the film formation process can be prevented, enabling a reduction in the material costs. Moreover any increases in the difficulty associated with controlling the crystal orientation and microstructure of the product film can also be prevented, and the MgO film can be deposited with good compactness onto the substrate, meaning any reduction in the film density can be prevented.

In addition, whereas splash particles from single crystal MgO are scale-shaped, and are thought to be generated by cleavage occurring at crystal planes, in the case of polycrystalline MgO such as the MgO vapor deposition material of the present embodiment, the splash particles are thought to be generated by rupture at crystal grain boundaries, and it is thought that because the shape of these splash particles is irregular, splash occurrence can be reduced.

In addition, because polycrystals display a higher brittleness than single crystals, even if micro cracks are generated within the material, these do not immediately result in splash. In other words, it is thought that compared with single crystal MgO, polycrystalline MgO pellets are able to offer a reduction in the splash occurrence by providing a reduction in the frequency with which the pellets themselves undergo splitting.

Furthermore in the present embodiment, because the polycrystalline material comprises a granular portion (a crystal grain portion) with a low sulfur S content, and a grain boundary portion with a higher sulfur S content than the granular portion, the level of splash occurrence can be reduced and the protective film characteristics can be improved.

Based on the various analysis results, it is thought that the above finding is due to the fact that the sulfur S gasification component in single crystal pellets is dispersed essentially uniformly throughout the pellets, whereas in polycrystalline pellets, the sulfur S gasification component is concentrated within the granular portion surface (the grain boundary section) and the pellet surface.

Furthermore in the present embodiment, because the polycrystalline material comprises a granular portion (a crystal grain portion) with a low chlorine Cl content, and a grain boundary portion with a higher chlorine Cl content than the granular portion, the level of splash occurrence can be reduced and the protective film characteristics can be improved.

Based on the various analysis results, it is thought that the above finding is due to the fact that the chlorine Cl gasification component in single crystal pellets is dispersed essentially uniformly throughout the pellets, whereas in polycrystalline pellets, the chlorine Cl gasification component is concentrated within the granular portion surface (the grain boundary section) and the pellet surface.

Furthermore in the present embodiment, because the polycrystalline material comprises a granular portion (a crystal grain portion) with a low nitrogen N content, and a grain boundary portion with a higher nitrogen N content than the granular portion, the level of splash occurrence can be reduced and the protective film characteristics can be improved.

Based on the various analysis results, it is thought that the above finding is due to the fact that the nitrogen N gasification component in single crystal pellets is dispersed essentially uniformly throughout the pellets, whereas in polycrystalline pellets, the nitrogen N gasification component is concentrated within the granular portion surface (the grain boundary section) and the pellet surface.

Furthermore in the present embodiment, because the polycrystalline material comprises a granular portion (a crystal grain portion) with a low phosphorus P content, and a grain boundary portion with a higher phosphorus P content than the granular portion, the level of splash occurrence can be reduced and the protective film characteristics can be improved.

Based on the various analysis results, it is thought that the above finding is due to the fact that the phosphorus P gasification component in single crystal pellets is dispersed essentially uniformly throughout the pellets, whereas in polycrystalline pellets, the phosphorus P gasification component is concentrated within the granular portion surface (the grain boundary section) and the pellet surface.

In other words, it is thought that by adopting an uneven distribution of the sulfur S, chlorine Cl, nitrogen N, and phosphorus P gasification components, which gasify and cause volumetric expansion when heated, then even when these gasification components undergo volumetric expansion upon heating during electron beam vapor deposition or the like, because the micro cracks generated by this volumetric expansion are formed along the grain boundaries, the phenomenon wherein this micro cracking acts as a trigger for causing splash occurrence can be suppressed.

In addition, because polycrystals display a higher brittleness than single crystals, even if micro cracks are generated within the material, these do not immediately result in splash. Furthermore, it is surmised that because the micro cracking generates a path through which the gasification component can escape, this further reduces the likelihood of splash occurrence.

It is thought that this is why the quantity of splash is lower in polycrystals than in single crystals.

In the present embodiment, by setting the ratio between the respective sulfur S contents within the granular portion and the grain boundary portion in the manner described above, the ratio between the sulfur S content within the granular portion and that within the grain boundary portion can be set, and not only can the brittleness of the material be reduced, but the quantity of the sulfur S gasification component, which acts as a trigger for splashing, can also be reduced, enabling a more effective suppression of splash occurrence.

In the present embodiment, by setting the ratio between the respective chlorine Cl contents within the granular portion and the grain boundary portion in the manner described above, the ratio between the chlorine Cl content within the granular portion and that within the grain boundary portion can be set, and not only can the brittleness of the material be reduced, but the quantity of the chlorine Cl gasification component, which acts as a trigger for splashing, can also be reduced, enabling a more effective suppression of splash occurrence.

In the present embodiment, by setting the ratio between the respective nitrogen N contents within the granular portion and the grain boundary portion in the manner described above, the ratio between the nitrogen N content within the granular portion and that within the grain boundary portion can be set, and not only can the brittleness of the material be reduced, but the quantity of the nitrogen N gasification component, which acts as a trigger for splashing, can also be reduced, enabling a more effective suppression of splash occurrence.

In the present embodiment, by setting the ratio between the respective phosphorus P contents within the granular portion and the grain boundary portion in the manner described above, the ratio between the phosphorus P content within the granular portion and that within the grain boundary portion can be set, and not only can the brittleness of the material be reduced, but the quantity of the phosphorus P gasification component, which acts as a trigger for splashing, can also be reduced, enabling a more effective suppression of splash occurrence.

In addition, by setting the thickness of the grain boundary portion to a value within a range from 1 to 200 nm, when the sulfur S, chlorine Cl, and nitrogen N, and phosphorus P gasification components undergo volumetric expansion upon heating, paths can be formed which allow these gasification components to readily escape from the pellets, enabling a further reduction in the likelihood of splash occurrence.

At this point, if the thickness of the grain boundary portion is set to a value less than 1 nm, then a grain boundary portion with comparatively high concentrations of the sulfur S, chlorine Cl, and nitrogen N, and phosphorus P gasification components cannot be formed satisfactorily, and consequently the gasification components cannot readily escape upon heating, resulting in an undesirable increase in splash occurrence. Furthermore, if the thickness of the grain boundary portion is set to a value exceeding 200 nm, then the respective quantities of the sulfur S, chlorine Cl, and nitrogen N gasification components become overly high, causing an undesirable increase in splash occurrence.

As follows is a detailed description of a second embodiment of a MgO vapor deposition material according to the present invention and a production process therefor.

In this embodiment, a degasified MgO powder similar to that of the first embodiment, with an average sulfur S content of 0.01 to 50 ppm, an average chlorine Cl content of 0.01 to 50 ppm, an average nitrogen N content of 0.01 to 200 ppm, an average phosphorus P content of 0.01 to 30 ppm, and a MgO purity of at least 99.0%, is subjected to electromelting and subsequent gradual cooling to form an ingot, and single crystal portions are then extracted from this ingot and crushed, thus preparing sheet-like single crystal pellets with a diameter of approximately 2 to 8 mm and a central diameter of approximately 5 mm. As a result, if these MgO single crystal pellets, which contain the gasification component quantities described above for this embodiment, are used to form a film on a plasma display panel, then in a similar manner to the first embodiment, a MgO film with minimal splash occurrence and favorable film characteristics can be obtained.

In the embodiment described above, the sulfur S, chlorine Cl and nitrogen N gasification components were all set as described above, but any one, or any plurality of these gasification components may be selected and their quantities set in the manner described above.

Furthermore, by setting all four different gasification components to the values described above at the same time, then as described above, the total gasification component quantity can be reduced, which enables a further decrease in the splash occurrence.

As follows is a description of specifics of the present invention based on a series of examples and comparative examples, although provided the gist of the invention is retained, the present invention is not limited to the following examples.

First, samples of commercially available MgO powders or clinker were subjected to high frequency melting, and the infrared absorption of the $SO_2$ gas discharged upon melting was used to determine the sulfur S content. Furthermore, atomic absorption and ICP (Inductively Coupled Plasma emission petrochemical analysis) were used to measure the MgO purity. In the case of clinker, the sample was crushed to form a powder. Furthermore, the MgO purity was determined as the value obtained by subtracting from 100% the quantities of the major metal atom impurities (Al, Si, Fe, Ca, Ni, Na, K, Zr, Cr, V, C), as determined by ICP.

The results are shown in Table 1A.

For the desulfurization treatment, each of these powders was combined with water to generate a $Mg(OH)_2$ solution, the sulfur S component was separated as $MgSO_4$, and the remaining solution was sintered in the atmosphere to remove the water component, thus yielding a desulfurized MgO powder with a low sulfur S content.

The sulfur S gasification component within each of these desulfurized MgO powders is also shown in Table 1A.

TABLE 1A

|  | Commercially available MgO powder/clinker | | Desulfurized MgO powder |
|---|---|---|---|
|  | Purity (%) | Sulfur content (ppm) | Sulfur content (ppm) |
| Example 1 | 99.99 | 70 | 6 |
| Example 2 | 99.9 | 150 | 30 |
| Example 3 | 99.9 | 160 | 30 |
| Example 4 | 99 | 300 | 50 |
| Example 5 | 99 | 320 | 40 |

EXAMPLES 1 TO 4

To a sample of a desulfurized MgO powder (with an average grain diameter of 0.3 µm) that had undergone desulfurization treatment as shown in the above Table 1A was added 1% by weight of polyethylene glycol as a binder, and a slurry with a concentration of 30% by weight was then prepared using methanol denatured alcohol as the dispersant. Subsequently, the slurry was subjected to wet mixing for 24 hours in a ball mill (using nylon coated steel balls with a diameter of 5 to 20 mm), the dispersant was then gasified at 80° C. in a vacuum dryer, and dry crushing was then used to form a granulated powder with an average grain diameter of 200 μm. This granulated powder was then molded into a product of outer diameter 6.7 mmφ and thickness 2.0 mm, using a uniaxial press apparatus and a pressure of 1000 kg/cm$^2$. The molded product was then placed in an electric furnace in a normal atmosphere, and then subjected to primary sintering for 1 hour at 1300° C., followed by secondary sintering for 3 hours at 1650° C. The thus obtained polycrystalline pellet had an outer diameter of 5.0±0.5 mmφ, and a thickness of 1.6±0.2 mm. These sintered disks were used as the examples 1 to 4.

EXAMPLE 5

A sample of desulfurized MgO powder that had undergone desulfurization treatment as shown in the above Table 1A was subjected to electromelting and subsequent gradual cooling to form an ingot, single crystal portions were then extracted from this ingot and crushed, yielding sheet-like single crystal pellets with a diameter of approximately 2 to 8 mm and a central diameter of approximately 5 mm, and these pellets were used as the example 5.

Comparative Examples 1 To 4

With the exception of using the MgO powders prior to desulfurization treatment, polycrystalline sintered pellets were prepared in the same manner as the examples 1 to 4, and used as the comparative examples 1 to 4.

Comparative Example 5

With the exception of using the MgO powder prior to desulfurization treatment, sheet-like single crystal pellets were prepared in the same manner as the example 5, and used as the comparative example 5.

<Comparative Tests and Evaluations>

(a) Measurement of Relative Density and Sulfur S Content

The relative densities of the pellets obtained in the examples 1 to 5 and the comparative examples 1 to 5 were measured in toluene using the Archimedes method. Furthermore, the sulfur S content of each of the MgO pellets was measured in the same manner as that used for the MgO powders.

The results are shown in Table 1B.

(b) Evaluation of Splash relative to Sulfur Content

In a splash test for a MgO vapor deposition material, a vapor deposition material produced in one of the examples 1 to 5 or one of the comparative examples 1 to 5 was placed in the hemispherical hearth (diameter 50 mm, depth 25 mm) of an electron beam deposition apparatus, the atmosphere was adjusted to an ultimate vacuum of 2.66×10$^{-4}$ Pa (2.0× 10$^{-6}$ Torr) and an O$_2$ partial pressure of 1.33×10$^{-2}$ Pa (1.0×10$^{-4}$ Torr), and the MgO vapor deposition material was heated by irradiation with an electron beam, using an accelerating voltage of 10 kV and a beam scan area of approximately 40 mmφ. The electron beam current was maintained at 90 mA for 10 minutes, and during that period the state inside the hearth was observed directly using a digital video camera, and the number of splash particles was counted and used for the evaluation.

The results are shown in Table 1B.

(c) Evaluation of Sputtering Resistance Relative to Sulfur Content

Using a MgO vapor deposition material produced in one of the examples 1 to 5 or one of the comparative examples 1 to 5, a thin film of MgO with a film thickness of approximately 8000 Å(800 nm) was formed on top of a silicon wafer with a pre-formed thermal oxidation film of film thickness 1000 Å(100 nm), under conditions including an ultimate vacuum of 2.66×10$^{-4}$ Pa (2.0×10$^{-6}$ Torr), an O$_2$ partial pressure of 1.33×10$^{-2}$ Pa (1.0×10$^{-4}$ Torr), a substrate temperature of 200° C., a separation distance between the MgO vapor deposition material and the substrate of 400 mm, and a film formation speed of 15 Å/second(1.5 nm/second). This thin film of MgO was subjected to surface etching using Ar ions (2 kV), and the sputtering resistance was evaluated on the basis of the value Sp obtained by dividing the film thickness by the time taken to etch away the entire film thickness. The time taken to etch away the entire film thickness was taken as the time at which the elemental concentration curves for the Mg component of the film and the Si component of the substrate intersect. Smaller Sp values indicate more favorable sputtering resistance.

The results are shown in Table 1B.

TABLE 1B

| | Relative density | Residual sulfur content within Mg pellet (ppm) | Splash (number) | Sputtering resistance Sp (Å/min) |
|---|---|---|---|---|
| Example 1 | 95.41 | 1 | 1 | 9.8 |
| Example 2 | 99.53 | 5 | 1 | 10.0 |
| Example 3 | 94.11 | 10 | 2 | 10.6 |
| Example 4 | 92.02 | 20 | 3 | 10.2 |
| Example 5 | 100.00 | 15 | 5 | 10.5 |
| Comparative example 1 | 94.00 | 80 | 12 | 11.8 |
| Comparative example 2 | 97.54 | 100 | 10 | 11.1 |
| Comparative example 3 | 92.57 | 120 | 16 | 12.5 |
| Comparative example 4 | 91.89 | 180 | 15 | 12.3 |
| Comparative example 5 | 99.89 | 60 | 24 | 12.1 |

From these results it is evident that when the MgO vapor deposition materials of the examples 1 to 5 were used, the number of splash occurrences was in single figures, and the Sp value was less than 11.0, whereas when the MgO vapor deposition materials of the comparative examples 1 to 5 were used, the number of splash occurrences was in double figures, and the Sp value was greater than 11.0, indicating a reduced level of sputtering resistance.

In a similar manner to above, samples of commercially available MgO powders or clinker were subjected to high frequency melting, the discharged chlorine gas was trapped, the spectral transmittance of the resulting aqueous solution was measured using a spectrophotometer, and this value was used to determine the chlorine Cl content. Furthermore, atomic absorption and ICP were used to measure the MgO purity. In the case of clinker, the sample was crushed to form a powder. Furthermore, the MgO purity was determined as the value obtained by subtracting from 100% the quantities of the major metal atom impurities (Al, Si, Fe, Ca, Ni, Na, K, Zr, Cr, V, C), as determined by ICP.

The results are shown in Table 2A.

Each of these powders was combined with water to generate a Mg(OH)$_2$ solution, the chlorine Cl component was separated as MgCl$_2$, and the remaining solution was sintered in the atmosphere to remove the water component, thus yielding a dechlorinated MgO powder with a low chlorine Cl content.

The chlorine Cl content within each of these dechlorinated MgO powders is also shown in Table 2A.

TABLE 2A

|  | Commercially available MgO powder/clinker | | Dechlorinated MgO powder |
| --- | --- | --- | --- |
|  | Purity (%) | Chlorine content (ppm) | Chlorine content (ppm) |
| Example 11 | 99.99 | 70 | 10 |
| Example 12 | 99.9 | 80 | 10 |
| Example 13 | 99.9 | 350 | 30 |
| Example 14 | 99 | 600 | 40 |
| Example 15 | 99 | 420 | 50 |

EXAMPLES 11 TO 14

To a sample of a dechlorinated MgO powder (with an average grain diameter of 0.3 μm) that had undergone dechlorination treatment as shown in the above Table 2A was added 1% by weight of polyethylene glycol as a binder, and a slurry with a concentration of 30% by weight was then prepared using methanol denatured alcohol as the dispersant. Subsequently, the slurry was subjected to wet mixing for 24 hours in a ball mill (using nylon coated steel balls with a diameter of 5 to 20 mm), the dispersant was then gasified at 80° C. in a vacuum dryer, and dry crushing was then used to form a granulated powder with an average grain diameter of 200 μm. This granulated powder was then molded into a product of outer diameter 6.7 mmϕ and thickness 2.0 mm, using a uniaxial press apparatus and a pressure of 1000 kg/cm$^2$. The molded product was then placed in an electric furnace in a normal atmosphere, and then subjected to primary sintering for 1 hour at 1300° C., followed by secondary sintering for 3 hours at 1650° C. The thus obtained polycrystalline pellet had an outer diameter of 5.0±0.5 mmϕ, and a thickness of 1.6±0.2 mm. These sintered disks were used as the examples 11 to 14.

EXAMPLE 15

A sample of dechlorinated MgO powder that had undergone dechlorination treatment as shown in the above Table 2A was subjected to electromelting and subsequent gradual cooling to form an ingot, single crystal portions were then extracted from this ingot and crushed, yielding sheet-like single crystal pellets with a diameter of approximately 2 to 8 mm and a central diameter of approximately 5 mm, and these pellets were used as the example 15.

Comparative Examples 11 To 14

With the exception of using the MgO powders prior to dechlorination treatment, polycrystalline sintered pellets were prepared in the same manner as the examples 11 to 14, and used as the comparative examples 11 to 14.

Comparative Example 15

With the exception of using the MgO powder prior to dechlorination treatment, sheet-like single crystal pellets were prepared in the same manner as the example 15, and used as the comparative example 15.

<Comparative Tests and Evaluations>

(a) Measurement of Relative Density and Chlorine Cl Content

The relative densities of the pellets obtained in the examples 11 to 15 and the comparative examples 11 to 15 were measured in toluene using the Archimedes method. Furthermore, the chlorine Cl content of each of the MgO pellets was measured in the same manner as that used for the MgO powders.

The results are shown in Table 2B.

(b) Evaluation of Splash Relative to Chlorine Content

In a splash test for a MgO vapor deposition material, a vapor deposition material produced in one of the examples 11 to 15 or one of the comparative examples 11 to 15 was placed in the hemispherical hearth (diameter 50 mm, depth 25 mm) of an electron beam deposition apparatus, the atmosphere was adjusted to an ultimate vacuum of 2.66×10$^{-4}$ Pa (2.0×10$^{-6}$ Torr) and an O$_2$ partial pressure of 1.33×10$^{-2}$ Pa (1.0×10$^{-4}$ Torr), and the MgO vapor deposition material was heated by irradiation with an electron beam, using an accelerating voltage of 10 kV and a beam scan area of approximately 40 mmϕ. The electron beam current was maintained at 90 mA for 10 minutes, and during that period the state inside the hearth was observed directly using a digital video camera, and the number of splash particles was counted and used for the evaluation.

The results are shown in Table 2B.

(c) Evaluation of Sputtering Resistance Relative to Chlorine Content

Using a MgO vapor deposition material produced in one of the examples 11 to 15 or one of the comparative examples 11 to 15, a thin film of MgO with a film thickness of approximately 8000 Å(800 nm) was formed on top of a silicon wafer with a pre-formed thermal oxidation film of film thickness 1000 Å(100 nm), under conditions including an ultimate vacuum of 2.66×10$^{-4}$ Pa (2.0×10$^{-6}$ Torr), an O$_2$ partial pressure of 1.33×10$^{-2}$ Pa (1.0×10$^{-4}$ Torr), a substrate temperature of 200° C., a separation distance between the MgO vapor deposition material and the substrate of 400 mm, and a film formation speed of 15 Å/second(15 nm/second). This thin film of MgO was subjected to surface etching using Ar ions (2 kV), and the sputtering resistance was evaluated on the basis of the value Sp obtained by dividing the film thickness by the time taken to etch away the entire film thickness. The time taken to etch away the entire film thickness was taken as the time at which the elemental concentration curves for the Mg component of the film and the Si component of the substrate intersect. Smaller Sp values indicate more favorable sputtering resistance.

The results are shown in Table 2B.

TABLE 2B

|  | Relative density | Residual chlorine content within Mg pellet (ppm) | Splash (number) | Sputtering resistance Sp (Å/min) |
| --- | --- | --- | --- | --- |
| Example 11 | 95.66 | 0.5 | 2 | 10.0 |
| Example 12 | 99.78 | 5 | 3 | 10.8 |

TABLE 2B-continued

|  | Relative density | Residual chlorine content within Mg pellet (ppm) | Splash (number) | Sputtering resistance Sp (Å/min) |
|---|---|---|---|---|
| Example 13 | 94.88 | 20 | 4 | 10.3 |
| Example 14 | 92.33 | 20 | 3 | 10.3 |
| Example 15 | 99.99 | 20 | 7 | 10.8 |
| Comparative example 11 | 93.88 | 60 | 20 | 11.2 |
| Comparative example 12 | 98.00 | 60 | 16 | 11.5 |
| Comparative example 13 | 92.99 | 200 | 26 | 12.2 |
| Comparative example 14 | 91.49 | 250 | 30 | 12 |
| Comparative example 15 | 99.94 | 210 | 27 | 12 |

From these results it is evident that when the MgO vapor deposition materials of the examples 11 to 15 were used, the number of splash occurrences was in single figures, and the Sp value was less than 11.0, whereas when the MgO vapor deposition materials of the comparative examples 11 to 15 were used, the number of splash occurrences was in double figures, and the Sp value was greater than 11.0, indicating a reduced level of sputtering resistance.

In a similar manner to above, samples of commercially available MgO powders or clinker were subjected to impulse melting, and the thermal conductivity of the discharged $NO_2$ gas was used to determine the nitrogen N content. Furthermore, atomic absorption and ICP were used to measure the MgO purity. In the case of clinker, the sample was crushed to form a powder. Furthermore, the MgO purity was determined as the value obtained by subtracting from 100% the quantities of the major metal atom impurities (Al, Si, Fe, Ca, Ni, Na, K, Zr, Cr, V, C), as determined by ICP.

The results are shown in Table 3A.

Each of these powders was subjected to denitrification treatment by vacuum heating at 330 to 500° C. for a period of 0.1 to 2 hours, thus yielding a denitrified MgO powder with a low nitrogen N content.

The nitrogen N content within each of these denitrified MgO powders is also shown in Table 3A.

TABLE 3A

|  | Commercially available MgO powder/clinker | | Denitrified MgO powder |
|---|---|---|---|
|  | Purity (%) | Nitrogen content (ppm) | Nitrogen content (ppm) |
| Example 21 | 99.9 | 270 | 80 |
| Example 22 | 99.9 | 300 | 150 |
| Example 23 | 99 | 400 | 180 |
| Example 24 | 99 | 410 | 50 |

EXAMPLES 21 TO 23

To a sample of a denitrified MgO powder (with an average grain diameter of 0.3 μm) that had undergone denitrification treatment as shown in the above Table 3A was added 1% by weight of polyethylene glycol as a binder, and a slurry with a concentration of 30% by weight was then prepared using methanol denatured alcohol as the dispersant. Subsequently, the slurry was subjected to wet mixing for 24 hours in a ball mill (using nylon coated steel balls with a diameter of 5 to 20 mm), the dispersant was then gasified at 80° C. in a vacuum dryer, and dry crushing was then used to form a granulated powder with an average grain diameter of 200 μm. This granulated powder was then molded into a product of outer diameter 6.7 mmφ and thickness 2.0 mm, using a uniaxial press apparatus and a pressure of 1000 kg/cm². The molded product was then placed in an electric furnace in a normal atmosphere, and then subjected to primary sintering for 1 hour at 1300° C., followed by secondary sintering for 3 hours at 1650° C. The thus obtained polycrystalline pellet had an outer diameter of 5.0±0.5 mmφ, and a thickness of 1.6±0.2 mm. These sintered disks were used as the examples 21 to 23.

EXAMPLE 24

A sample of denitrified MgO powder that had undergone denitrification treatment as shown in the above Table 3A was subjected to electromelting and subsequent gradual cooling to form an ingot, single crystal portions were then extracted from this ingot and crushed, yielding sheet-like single crystal pellets with a diameter of approximately 2 to 8 mm and a central diameter of approximately 5 mm, and these pellets were used as the example 24.

Comparative Examples 21 To 23

With the exception of using the MgO powders prior to denitrification treatment, polycrystalline sintered pellets were prepared in the same manner as the examples 21 to 23, and used as the comparative examples 21 to 23.

Comparative Example 24

With the exception of using the MgO powder prior to denitrification treatment, sheet-like single crystal pellets were prepared in the same manner as the example 24, and used as the comparative example 24.

<Comparative Tests and Evaluations>

(a) Measurement of Relative Density and Nitrogen N Content

The relative densities of the pellets obtained in the examples 21 to 24 and the comparative examples 21 to 24 were measured in toluene using the Archimedes method. Furthermore, the nitrogen N content of each of the MgO pellets was measured in the same manner as that used for the MgO powders.

The results are shown in Table 3B.

(b) Evaluation of Splash Relative to Nitrogen Content

In a splash test for a MgO vapor deposition material, a vapor deposition material produced in one of the examples 21 to 24 or one of the comparative examples 21 to 24 was placed in the hemispherical hearth (diameter 50 mm, depth 25 mm) of an electron beam deposition apparatus, the atmosphere was adjusted to an ultimate vacuum of $2.66 \times 10^{-4}$ Pa ($2.0 \times 10^{-6}$ Torr) and an $O_2$ partial pressure of $1.33 \times 10^{-2}$ Pa ($1.0 \times 10^{-4}$ Torr), and the MgO vapor deposition material was heated by irradiation with an electron beam, using an accelerating voltage of 10 kV and a beam scan area of approximately 40 mmφ. The electron beam current was maintained at 90 mA for 10 minutes, and during that period the state inside the hearth was observed directly using a digital video camera, and the number of splash particles was counted and used for the evaluation.

The results are shown in Table 3B.

(c) Evaluation of Sputtering Resistance Relative to Nitrogen Content

Using a MgO vapor deposition material produced in one of the examples 21 to 24 or one of the comparative examples 21 to 24, a thin film of MgO with film thickness of approximately 8000 Å (800 nm)was formed on top of a silicon wafer with a pre-formed thermal oxidation film of film thickness 1000 Å(100 nm), under conditions including an ultimate vacuum of $2.66 \times 10^{-4}$ Pa ($2.0 \times 10^{-6}$ Torr), an $O_2$ partial pressure of $1.33 \times 10^{-2}$ Pa ($1.0 \times 10^{-4}$ Torr), a substrate temperature of 200° C., a separation distance between the MgO vapor deposition material and the substrate of 400 mm, and a film formation speed of 15 Å/second(1.5 nm/second). This thin film of MgO was subjected to surface etching using Ar ions (2 kV), and the sputtering resistance was evaluated on the basis of the value Sp obtained by dividing the film thickness by the time taken to etch away the entire film thickness. The time taken to etch away the entire film thickness was taken as the time at which the elemental concentration curves for the Mg component of the film and the Si component of the substrate intersect. Smaller Sp values indicate more favorable sputtering resistance.

The results are shown in Table 3B.

TABLE 3B

|  | Relative density | Residual nitrogen content within Mg pellet (ppm) | Splash (number) | Sputtering resistance Sp (Å/min) |
|---|---|---|---|---|
| Example 21 | 99.50 | 0.5 | 3 | 10.7 |
| Example 22 | 94.84 | 20 | 2 | 10.6 |
| Example 23 | 92.22 | 100 | 3 | 10.8 |
| Example 24 | 100.00 | 40 | 6 | 10.8 |
| Comparative example 21 | 97.13 | 230 | 15 | 11.3 |
| Comparative example 22 | 92.88 | 250 | 22 | 12.0 |
| Comparative example 23 | 91.41 | 330 | 18 | 12.2 |
| Comparative example 24 | 99.80 | 300 | 26 | 12.5 |

From these results it is evident that when the MgO vapor deposition materials of the examples 21 to 24 were used, the number of splash occurrences was in single figures, and the Sp value was less than 11.0, whereas when the MgO vapor deposition materials of the comparative examples 21 to 24 were used, the number of splash occurrences was in double figures, and the Sp value was greater than 11.0, indicating a reduced level of sputtering resistance.

In a similar manner to above, samples of commercially available MgO powders or clinker were subjected to impulse melting, and the thermal conductivity of the discharged $PO_2$ gas was used to determine the phosphorus P content. Furthermore, atomic absorption and ICP were used to measure the MgO purity. In the case of clinker, the sample was crushed to form a powder. Furthermore, the MgO purity was determined as the value obtained by subtracting from 100% the quantities of the major metal atom impurities (Al, Si, Fe, Ca, Ni, Na, K, Zr, Cr, V, C), as determined by ICP.

The results are shown in Table 4A.

Each of these powders was subjected to dephosphorylation treatment by vacuum heating at 800 to 1200° C. for a period of 0.1 to 2 hours, thus yielding a dephosphorylated MgO powder with a low phosphorus P content.

The phosphorus P content within each of these dephosphorylated MgO powders is also shown in Table 4A.

TABLE 4A

|  | Commercially available MgO powder/clinker | | Dephosphorylated MgO powder |
|---|---|---|---|
|  | Purity (%) | Phosphorus content (ppm) | Phosphorus content (ppm) |
| Example 32 | 99.99 | 50 | 5 |
| Example 32 | 99.9 | 100 | 20 |
| Example 33 | 99.9 | 120 | 15 |
| Example 34 | 99 | 180 | 30 |
| Example 35 | 99 | 200 | 15 |

EXAMPLES 31 TO 34

To a sample of a dephosphorylated MgO powder (with an average grain diameter of 0.3 μm) that had undergone dephosphorylation treatment as shown in the above Table 14A was added 1% by weight of polyethylene glycol as a binder, and a slurry with a concentration of 30% by weight was then prepared using methanol denatured alcohol as the dispersant. Subsequently, the slurry was subjected to wet mixing for 24 hours in a ball mill (using nylon coated steel balls with a diameter of 5 to 20 mm), the dispersant was then gasified at 80° C. in a vacuum dryer, and dry crushing was then used to form a granulated powder with an average grain diameter of 200 μm. This granulated powder was then molded into a product of outer diameter 6.7 mmφ and thickness 2.0 mm, using a Biaxial press apparatus and a pressure of 1000 kg/cm². The molded product was then placed in an electric furnace in a normal atmosphere, and then subjected to primary sintering for 1 hour at 1300° C., followed by secondary sintering for 3 hours at 1650° C. The thus obtained polycrystalline pellet had an outer diameter of 5.0±0.5 mmφ, and a thickness of 1.6±0.2 mm. These sintered disks were used as the examples 31 to 34.

EXAMPLE 35

A sample of dephosphorylated MgO powder that had undergone dephosphorylation treatment as shown in the above Table 14A was subjected to electromelting and subsequent gradual cooling to form an ingot, single crystal portions were then extracted from this ingot and crushed, yielding sheet-like single crystal pellets with a diameter of approximately 2 to 8 mm and a central diameter of approximately 5 mm, and these pellets were used as the example 35.

Comparative Examples 31 To 34

With the exception of using the MgO powders prior to dephosphorylation treatment, polycrystalline sintered pellets were prepared in the same manner as the examples 31 to 34, and used as the comparative examples 31 to 34.

Comparative Example 35

With the exception of using the MgO powder prior to dephosphorylation treatment, sheet-like single crystal pellets were prepared in the same manner as the example 35, and used as the comparative example 35.

<Comparative Tests and Evaluations>

(a) Measurement of Relative Density and Phosphorus P Content

The relative densities of the pellets obtained in the examples 31 to 35 and the comparative examples 31 to 35 were measured in toluene using the Archimedes method. Furthermore, the phosphorus P content of each of the MgO pellets was measured in the same manner as that used for the MgO powders.

The results are shown in Table 4B.

(b) Evaluation of Splash Relative to Phosphorus Content

In a splash test for a MgO vapor deposition material, a vapor deposition material produced in one of the examples 31 to 35 or one of the comparative examples 31 to 35 was placed in the hemispherical hearth (diameter 50 mm, depth 25 mm) of an electron beam deposition apparatus, the atmosphere was adjusted to an ultimate vacuum of $2.66\times10^{-4}$ Pa ($2.0\times10^{-6}$ Torr) and an $O_2$ partial pressure of $1.33\times10^{-2}$ Pa ($1.0\times10^{-4}$ Torr), and the MgO vapor deposition material was heated by irradiation with an electron beam, using an accelerating voltage of 10 kV and a beam scan area of approximately 40 mmφ. The electron beam current was maintained at 90 mA for 10 minutes, and during that period the state inside the hearth was observed directly using a digital video camera, and the number of splash particles was counted and used for the evaluation.

The results are shown in Table 4B.

(c) Evaluation of Sputtering Resistance Relative to Phosphorus Content

Using a MgO vapor deposition material produced in one of the examples 31 to 35 or one of the comparative examples 31 to 35, a thin film of MgO with a film thickness of approximately 8000 Å(800 nm) was formed on top of a silicon wafer with a pre-formed thermal oxidation film of film thickness 1000 Å(100 nm), under conditions including an ultimate vacuum of $2.66\times10^{-4}$ Pa ($2.0\times10^{-6}$ Torr), an $O_2$ partial pressure of $1.33\times10^{-2}$ Pa ($1.0\times10^{-4}$ Torr), a substrate temperature of 200° C., a separation distance between the MgO vapor deposition material and the substrate of 400 mm, and a film formation speed of 15 Å/second(1.5 nm/second). This thin film of MgO was subjected to surface etching using Ar ions (2 kV), and the sputtering resistance was evaluated on the basis of the value Sp obtained by dividing the film thickness by the time taken to etch away the entire film thickness. The time taken to etch away the entire film thickness was taken as the time at which the elemental concentration curves for the Mg component of the film and the Si component of the substrate intersect. Smaller Sp values indicate more favorable sputtering resistance.

The results are shown in Table 4B.

TABLE 4B

| | Relative density | Residual phosphorus content within Mg pellet (ppm) | Splash (number) | Sputtering resistance Sp (Å/min) |
|---|---|---|---|---|
| Example 31 | 95.20 | 0.5 | 1 | 10.0 |
| Example 32 | 99.01 | 17 | 1 | 9.8 |
| Example 33 | 95.01 | 8 | 2 | 10.8 |
| Example 34 | 92.77 | 20 | 2 | 10.9 |
| Example 35 | 100.00 | 10 | 7 | 10.7 |
| Comparative example 31 | 94.88 | 40 | 13 | 11.6 |
| Comparative example 32 | 97.54 | 60 | 10 | 11.6 |
| Comparative example 33 | 92.57 | 70 | 19 | 12.0 |
| Comparative example 34 | 91.89 | 120 | 11 | 12.5 |
| Comparative example 35 | 99.89 | 50 | 19 | 12.0 |

From these results it is evident that when the MgO vapor deposition materials of the examples 31 to 35 were used, the number of splash occurrences was in single figures, and the Sp value was less than 11.0, whereas when the MgO vapor deposition materials of the comparative examples 31 to 35 were used, the number of splash occurrences was in double figures, and the Sp value was greater than 11.0, indicating a reduced level of sputtering resistance.

<Comparative Tests and Evaluations (continued)>

(d) Hardness (Material Brittleness) Comparison between Single Crystals and Polycrystals The polycrystalline pellets formed by sintering of the example 3, and the single crystal pellets formed by electromelting of the example 5 were subjected to Vickers hardness (Hv) and fracture toughness ($K_{IC}$) measurements.

The Vickers hardness (Hv) measurements produced results of 608±35 and 698±51 (actual measured values) for the example 3 and the example 5 respectively, with the result for the single crystals of the example 5 being approximately 15% higher, whereas the fracture toughness ($K_{IC}$) measurements produced results of 1.91 Mpa.m$^{1/2}$ and 1.26 Mpa.m$^{1/2}$ (actual measured values) for the example 3 and the example 5 respectively, with the result for the single crystals of the example 5 being approximately 34% lower. It is thought that these results suggest that in the case of single crystals, once a micro crack forms, it immediately propagates, making the occurrence of splash of vapor deposition material fragments more likely.

(e) Splash Comparative Tests Based on Crystal Type

Using the same splash evaluation described in section (b) above, splash tests were conducted using the polycrystalline pellets of the example 3 and the single crystal pellets of the example 5.

The splash evaluations were essentially the same as those described above, although the electron beam current was increased sequentially from 30 to 240 mA, and the values obtained by maintaining each current for 1 minute were recorded. The results are shown in FIG. 1.

From the results shown in FIG. 1 it is evident that compared with the single crystal pellets, the polycrystalline pellets of the example 3 displayed less than half the level of splash occurrence.

Furthermore, the splash particles that were generated in the tests were also examined. The results are shown in FIG. 2.

Figure 2:
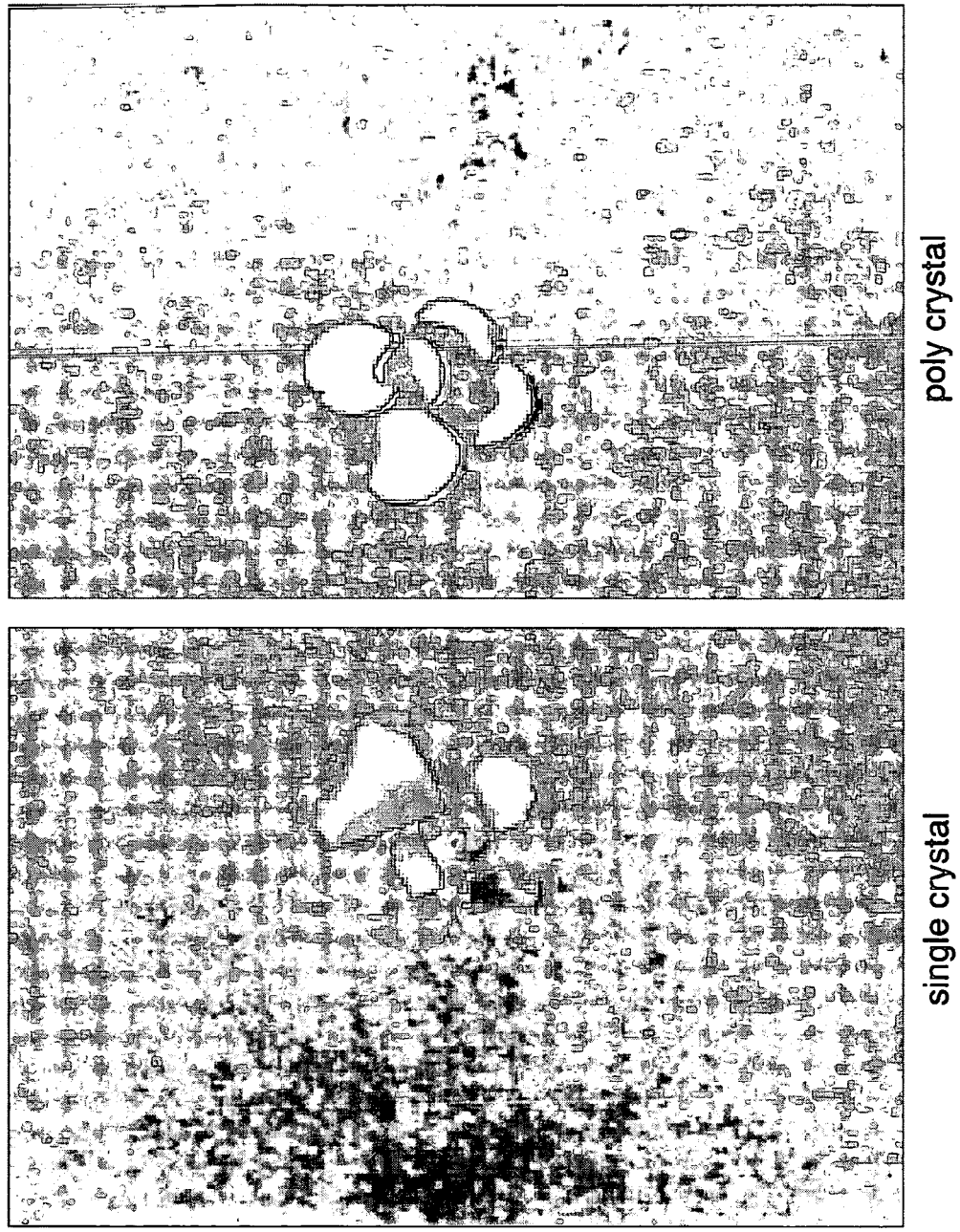
FIG. 2 shows the results of splash tests for examples of the MgO vapor deposition material according to the present invention and the production process therefor, and represents images of splash particles from a single crystal material and a polycrystalline material.

As can be seen in FIG. 2, the splash particles from the single crystals are scale-shaped, and it is surmised that these are generated by cleavage occurring at crystal planes. In contrast, in the case of polycrystals, the splash particles are of irregular shape, and it is thought that these are generated by rupture at crystal grain boundaries. In single crystals the gasification components are distributed uniformly through the interior of the crystals, whereas in the case of polycrystals, the gasification components are concentrated at the surface or grain boundary interface (as indicated by each of the analysis results), and it is thought that volumetric expansion on heating of the gasification component in the interior of the material acts as a trigger for splash occurrence. Because polycrystals display a higher brittleness than single crystals, even if micro cracks are generated within the material, these do not immediately result in splash. Furthermore, it is surmised that because the micro cracking generates a path through which the gasification component can escape, this further reduces the likelihood of splash occurrence. It is thought that this is why the quantity of splash observed was lower in polycrystals than in single crystals (see Table 1B, Table 2B, Table 3B, Table 4B and FIG. 1). As described above, the brittleness of the material is also important, although from the results shown in Table 1B, Table 2B, Table 3B and Table 4B it is evident that reducing the gasification components that act as triggers for splash occurrence is even more effective in further suppressing splash.

(f) Evaluation of Gasification Component Distribution

Using the polycrystalline pellets of the example 4, the following compositional and structural analyses were performed for the granular portion, the grain boundary portion, the outermost surface portion and the overall pellets.

1. Grain Boundary—Granular Portion Analyses: 30 nmφ analysis points were analyzed using TEM-EDX (shape observation using a transmission electron microscope).
2. Outermost Surface Analysis: Evaluated using ESCA. The sample surface was subjected to sputter etching with argon ions for 0.5 minutes (equivalent to approximately 0.5 nm of etching from the outermost surface) and then cleaned, before surface analysis was conducted. Analysis depth was from 0.5 to 5 nm.
3. Overall Analysis: The entire sample was subjected to high frequency melting, and the sulfur S content was determined by measuring the infrared absorption of the discharged $SO_2$ gas.
4. Overall Analysis: The entire sample subjected to high frequency melting, the discharged chlorine gas was trapped, the spectral transmittance of the resulting aqueous solution was measured using a spectrophotometer, and this value was used to determine the chlorine Cl content.
5. Overall Analysis: The entire sample was subjected to high frequency melting, and the nitrogen N content was determined by measuring the thermal conductivity of the discharged $NO_2$ gas.
6. Overall Analysis: The entire sample was subjected to high frequency melting, and the nitrogen P content was determined by measuring the thermal conductivity of the discharged $PO_2$ gas.

Figure 3:
FIG. 3 shows the results of gasification component distribution evaluations for examples of the MgO vapor deposition material according to the present invention and the production process therefor, and represents a TEM photograph of a sample cross section, and the measurement positions therein.

These results are shown in Table 5, Table 6 and FIG. 3.

FIG. 3 shows a TEM photograph of a sample cross section, and in this figure, numerals 1 to 5 show measurement points, wherein numerals 1 to 3 are positioned at grain boundary portions, and numerals 4 and 5 are positioned within crystal grain portions (granular portions). In the tables, these points 1 to 5 are labeled as #1 to #5 respectively.

TABLE 5

Grain boundary (analysis area: 30 nmφ)

|    | #1    | #2    | #3    | average |
|----|-------|-------|-------|---------|
| Mg | 48.87 | 48.54 | 47.75 | 48.39   |
| O  | 49.78 | 50.53 | 50.94 | 50.42   |
| Si | 0.60  | 0.64  | 0.72  | 0.65    |
| Fe | 0.19  | 0.04  | 0.13  | 0.12    |
| Cr | 0.00  | 0.00  | 0.01  | 0.00    |
| Ca | 0.02  | 0.00  | 0.00  | 0.01    |
| Al | 0.26  | 0.00  | 0.23  | 0.16    |
| Ni | 0.00  | 0.00  | 0.00  | 0.00    |
| Na | 0.08  | 0.00  | 0.00  | 0.03    |
| K  | 0.00  | 0.03  | 0.00  | 0.01    |
| Cl | 0.01  | 0.01  | 0.00  | 0.01    |
| N  | 0.14  | 0.14  | 0.13  | 0.14    |
| S  | 0.04  | 0.03  | 0.03  | 0.03    |
| P  | 0.04  | 0.04  | 0.04  | 0.04    |

Units: Atom %

TABLE 6

Grain interior (analysis area: 30 nmφ)

|    | #4    | #5    | average |
|----|-------|-------|---------|
| Mg | 48.87 | 48.54 | 48.71   |
| O  | 50.52 | 51.18 | 50.85   |
| Si | 0.04  | 0.20  | 0.12    |
| Fe | 0.00  | 0.00  | 0.00    |
| Cr | 0.01  | 0.02  | 0.01    |
| Ca | 0.02  | 0.03  | 0.02    |
| Al | 0.00  | 0.00  | 0.00    |
| Ni | 0.00  | 0.00  | 0.00    |
| Na | 0.49  | 0.00  | 0.25    |
| K  | 0.01  | 0.00  | 0.01    |
| Cl | 0.00  | 0.00  | 0.00    |
| N  | 0.02  | 0.02  | 0.02    |
| S  | 0.00  | 0.00  | 0.00    |
| P  | 0.00  | 0.00  | 0.00    |

Units: Atom %

Results

1. Sulfur S was confirmed as being concentrated in the grain boundary portion at 0.03 atom %, whereas in the granular portion, the concentration of sulfur S was lower than the detection limit, and could not be directly detected.

The sulfur S in the polycrystal outermost layer is present as sulfates, in a concentration of 0.9 atom %, and it is assumed that this is also true of the grain boundary portion.

In contrast, in the infrared absorption analysis, the sulfur S content was 20 ppm (0.002% by weight), meaning the approximate quantity of sulfur S is less than 0.0016 atom %, and indicating that the vast majority of sulfur S exists at the grain boundaries, and that the ratio of sulfur in the grain boundary portion relative to the granular portion is at least 18.

2. Chlorine Cl was confirmed as being concentrated in the grain boundary portion at 0.01 atom %, whereas in the granular portion, the concentration of chlorine Cl was lower than the detection limit, and could not be directly detected.

The chlorine in the polycrystal outermost layer is present as chlorides, and it is assumed that this is also true of the grain boundary portion.

In contrast, in the spectral transmittance analysis, the chlorine Cl content was 20 ppm (0.002% by weight), meaning the approximate quantity of chlorine Cl is less than 0.002 atom %, and indicating that the vast majority of chlorine Cl exists at the grain boundaries, and that the ratio of chlorine Cl in the grain boundary portion relative to the granular portion is at least 5.

3. Nitrogen N was confirmed as being concentrated in the grain boundary portion at 0.14 atom %, whereas in the granular portion, only 0.02 atom % was detected.

The nitrogen N in the polycrystal outermost layer is present as composites of ammonium salts, ammonia and nitrides, and it is assumed that this is also true of the grain boundary portion.

In contrast, in the overall analysis, the nitrogen N content was 100 ppm (0.01% by weight), meaning the approximate quantity of nitrogen N is less than 0.015 atom %, and indicating that the vast majority of nitrogen N exists at the grain boundaries, and that the ratio of nitrogen N in the grain boundary portion relative to the granular portion is from 7 to 9.

4. Phosphorus P was confirmed as being concentrated in the grain boundary portion at 0.04 atom %, whereas in the granular portion, the concentration of phosphorus P was lower than the detection limit, and could not be directly detected.

The phosphorus P in the polycrystal outermost layer is present in a variety of forms such as phosphates, phosphoric acid ($P_4O_{10}$) and metaphosphates, and it is assumed that this is also true of the grain boundary portion.

In contrast, in the overall analysis, the phosphorus P content was 30 ppm (0.003% by weight), meaning the approximate quantity of phosphorus P is less than 0.003 atom %, and indicating that the vast majority of phosphorus P exists at the grain boundaries, and that the ratio of phosphorus P in the grain boundary portion relative to the granular portion is at least 13.

In this manner, from the results of Table 5 and Table 6 it is clear that almost no gasification component exists in the crystal grain portion (the granular portion), and that the gasification component is concentrated almost entirely within the grain boundary portion.

INDUSTRIAL APPLICABILITY

According to a MgO vapor deposition material of the present invention, by ensuring a MgO purity of at least 99.0%, a relative density of at least 90.0%, a sulfur S content of 0.01 to 50 ppm, a chlorine Cl content of 0.01 to 50 ppm, a nitrogen N content of 0.01 to 200 ppm, and a phosphorus P content of 0.01 to 30 ppm, when the MgO vapor deposition material is used for forming a MgO protective film for an AC type PDP or the like by either an electron beam deposition method or an ion plating method, the level of splash occurrence can be reduced, and the protective film characteristics such as the MgO film density, the film thickness distribution, the light transmittance, the sputtering resistance, the discharge characteristics (such as the discharge voltage and the discharge response), and the insulating characteristics can be improved.

Furthermore, in a production process for a MgO vapor deposition material according to the present invention, by using a MgO powder with a sulfur S content of 0.01 to 50 ppm, a chlorine Cl content of 0.01 to 50 ppm, a nitrogen N content of 0.01 to 200 ppm, and a phosphorus P content of 0.01 to 30 ppm as the raw material, the type of MgO vapor deposition material described above can be produced.

The invention claimed is:

1. A MgO vapor deposition material comprising polycrystalline pellets with a MgO purity of at least 99.0%, a relative density of at least 90.0%, and a gasification component content of 0.01 to 200 ppm.

2. A MgO vapor deposition material according to claim 1, comprising polycrystalline pellets with a MgO purity of at least 99.0%, a relative density of at least 90.0%, and an average sulfur S content of 0.01 to 50 ppm.

3. A MgO vapor deposition material according to claim 2, wherein said polycrystalline pellets comprise a granular portion with a low sulfur S content, and a grain boundary portion with a higher sulfur S content than said granular portion.

4. A MgO vapor deposition material according to claim 3, wherein a ratio between respective sulfur S contents within said granular portion and said grain boundary portion is greater than 5.

5. A MgO vapor deposition material according to claim 1, comprising polycrystalline pellets with a MgO purity of at least 99.0%, a relative density of at least 90.0%, and an average chlorine Cl content of 0.01 to 50 ppm.

6. A MgO vapor deposition material according to claim 5, wherein said polycrystalline pellets comprise a granular portion with a low chlorine Cl content, and a grain boundary portion with a higher chlorine Cl content than said granular portion.

7. A MgO vapor deposition material according to claim 6, wherein a ratio between respective chlorine Cl contents within said granular portion and said grain boundary portion is greater than 5.

8. A MgO vapor deposition material according to claim 1, comprising polycrystalline pellets with a MgO purity of at least 99.0%, a relative density of at least 90.0%, and an average nitrogen N content of 0.01 to 200 ppm.

9. A MgO vapor deposition material according to claim 8, wherein said polycrystalline pellets comprise a granular portion with a low nitrogen N content, and a grain boundary portion with a higher nitrogen N content than said granular portion.

10. A MgO vapor deposition material according to claim 9, wherein a ratio between respective nitrogen N contents within said granular portion and said grain boundary portion is greater than 5.

11. A MgO vapor deposition material according to claim 1, comprising polycrystalline pellets with a MgO purity of at least 99.0%, a relative density of at least 90.0%, and an average phosphorus P content of 0.01 to 30 ppm.

12. A MgO vapor deposition material according to claim 11, wherein said polycrystalline pellets comprise a granular portion with a low phosphorus P content, and a grain boundary portion with a higher phosphorus P content than said granular portion.

13. A MgO vapor deposition material according to claim 12, wherein a ratio between respective phosphorus P contents within said granular portion and said grain boundary portion is greater than 5.

14. A production process for a MgO vapor deposition material, wherein polycrystalline pellets are produced by a sintering process using a MgO powder with a purity of at least 99.0% and a gasification component content of 0.01 to 200 ppm as a raw material.

15. A production process for a MgO vapor deposition material according to claim 14, wherein said polycrystalline pellets are produced by a sintering process using a MgO powder with a purity of at least 99.0% and a sulfur S content of 0.01 to 50 ppm as a raw material.

16. A production process for a MgO vapor deposition material according to claim 15, wherein said polycrystalline pellets comprise a granular portion with a low sulfur S content, and a grain boundary portion with a higher sulfur S content than said granular portion.

17. A production process for a MgO vapor deposition material according to claim 16, wherein a ratio between respective sulfur S contents within said granular portion and said grain boundary portion is greater than 5.

18. A production process for a MgO vapor deposition material according to claim 14, wherein said polycrystalline pellets are produced by a sintering process using a MgO powder with a purity of at least 99.0% and a chlorine Cl content of 0.01 to 50 ppm as a raw material.

19. A production process for a MgO vapor deposition material according to claim 18, wherein said polycrystalline pellets comprise a granular portion with a low chlorine Cl content, and a grain boundary portion with a higher chlorine Cl content than said granular portion.

20. A production process for a MgO vapor deposition material according to claim 19, wherein a ratio between respective chlorine Cl contents within said granular portion and said grain boundary portion is greater than 5.

21. A production process for a MgO vapor deposition material according to claim 14, wherein said polycrystalline pellets are produced by a sintering process using a MgO powder with a purity of at least 99.0% and a nitrogen N content of 0.01 to 200 ppm as a raw material.

22. A production process for a MgO vapor deposition material according to claim 21, wherein said polycrystalline pellets comprise a granular portion with a low nitrogen N content, and a grain boundary portion with a higher nitrogen N content than said granular portion.

23. A production process for a MgO vapor deposition material according to claim 22, wherein a ratio between respective nitrogen N contents within said granular portion and said grain boundary portion is greater than 5.

24. A production process for a MgO vapor deposition material according to claim 14, wherein said polycrystalline pellets are produced by a sintering process using a MgO powder with a purity of at least 99.0% and a phosphorus P content of 001 to 30 ppm as a raw material.

25. A production process for a MgO vapor deposition material according to claim 24, wherein said polycrystalline pellets comprise a granular portion with a low phosphorus P content, and a grain boundary portion with a higher phosphorus P content than said granular portion.

26. A production process for a MgO vapor deposition material according to claim 25, wherein a ratio between respective phosphorus P contents within said granular portion and said grain boundary portion is greater than 5.

* * * * *